(12) United States Patent
Ebert et al.

(10) Patent No.: US 12,326,670 B2
(45) Date of Patent: Jun. 10, 2025

(54) LITHOGRAPHIC APPARATUS, METROLOGY SYSTEM, AND INTENSITY IMBALANCE MEASUREMENT FOR ERROR CORRECTION

(71) Applicant: ASML Holding N.V., Veldhoven (NL)

(72) Inventors: Earl William Ebert, Oxford, CT (US); Roxana Rezvani Naraghi, Easton, CT (US)

(73) Assignee: ASML HOLDING N.V., Veldhoven (NL)

( * ) Notice: Subject to any disclaimer, the term of this patent is extended or adjusted under 35 U.S.C. 154(b) by 219 days.

(21) Appl. No.: 18/023,162

(22) PCT Filed: Jul. 24, 2021

(86) PCT No.: PCT/EP2021/070766
§ 371 (c)(1),
(2) Date: Feb. 24, 2023

(87) PCT Pub. No.: WO2022/042966
PCT Pub. Date: Mar. 3, 2022

(65) Prior Publication Data
US 2023/0324817 A1 Oct. 12, 2023

Related U.S. Application Data

(60) Provisional application No. 63/070,553, filed on Aug. 26, 2020.

(51) Int. Cl.
*G03F 9/00* (2006.01)
*G03F 7/00* (2006.01)

(52) U.S. Cl.
CPC ........ *G03F 9/7088* (2013.01); *G03F 7/70625* (2013.01); *G03F 7/70633* (2013.01); *G03F 7/706851* (2023.05)

(58) Field of Classification Search
CPC ............. G03F 7/70605; G03F 7/70616; G03F 7/70625; G03F 7/70633; G03F 7/706843;
(Continued)

(56) References Cited

U.S. PATENT DOCUMENTS 5,420,417 A * 5/1995 Shiraishi ............. G03F 7/70108
356/121
6,297,876 B1 10/2001 Bornebroek
(Continued)

FOREIGN PATENT DOCUMENTS

JP H06-045216 A 2/1994
JP 2016-505167 A 2/2016

OTHER PUBLICATIONS

International Search Report and Written Opinion of the International Searching Authority directed to International Patent Application No. PCT/EP2021/070766, mailed Nov. 8, 2021; 9 pages.
(Continued)

*Primary Examiner* — Steven H Whitesell
(74) *Attorney, Agent, or Firm* — Sterne, Kessler, Goldstein & Fox P.L.L.C.

(57) ABSTRACT

A metrology system includes a beam splitter and first and second sensors. The beam splitter splits scattered radiation scattered by a target into first and second portions of radiation. The first sensor receives the first portion. The second sensor receives the second portion after the second portion propagates along a path that includes a wedge system comprising a first wedge configured to diverge the second portion.

20 Claims, 14 Drawing Sheets

(58) Field of Classification Search
CPC ......... G03F 7/706845; G03F 7/706851; G03F 9/7019; G03F 9/7088
See application file for complete search history.

(56) References Cited

U.S. PATENT DOCUMENTS

| | | | |
|---|---|---|---|
| 6,961,116 | B2 | 11/2005 | Den Boef et al. |
| 7,511,799 | B2 | 3/2009 | Tel et al. |
| 8,706,442 | B2 | 4/2014 | Mos et al. |
| 2004/0174508 | A1* | 9/2004 | Den Boef ............. G03F 9/7011 356/399 |
| 2005/0133743 | A1 | 6/2005 | Schets et al. |
| 2007/0296973 | A1 | 12/2007 | Kiers et al. |
| 2009/0195768 | A1 | 8/2009 | Bijnen et al. |
| 2011/0102753 | A1* | 5/2011 | Van De Kerkhof .. G03F 9/7088 356/326 |
| 2012/0206703 | A1 | 8/2012 | Bhattacharyya et al. |
| 2012/0225152 | A1* | 9/2012 | Wuister ................ G03F 9/7088 425/150 |
| 2015/0176979 | A1* | 6/2015 | Mathijssen ............ G01B 11/14 356/508 |
| 2016/0377990 | A1* | 12/2016 | Quintanilha ........ G03F 7/70633 355/67 |
| 2019/0219931 | A1 | 7/2019 | Zwier |

OTHER PUBLICATIONS

International Preliminary Report on Patentability directed to International Patent Application No. PCT/EP2021/070766, issued Feb. 28, 2023; 7 pages.

Niu et al., "Specular Spectroscopic Scatterometry in DUV Lithography," Proc. SPIE, vol. 3677, Metrology, Inspection, and Process Control for Microlithography XIII, Jun. 14, 1999; 10 pages.

Raymond et al., "Multiparameter grating metrology using optical scatterometry," Journal of Vacuum Science & Technology B: Microelectronics and Nanometer Structures Processing, Measurement, and Phenomena, Jun. 4, 1998; pp. 361-368.

Notice of Reasons for Refusal directed to Japanese Patent Application No. 2023- 509489, mailed Mar. 18, 2025; 13 pages.

* cited by examiner

LITHOGRAPHIC APPARATUS, METROLOGY SYSTEM, AND INTENSITY IMBALANCE MEASUREMENT FOR ERROR CORRECTION

CROSS-REFERENCE TO RELATED APPLICATIONS

This application claims priority of U.S. Provisional Patent Application No. 63/070,553, which was filed on Aug. 26, 2020, and which is incorporated herein in its entirety by reference.

FIELD

The present disclosure relates to metrology systems, for example, improving accurate positioning of wafers in lithographic apparatuses and systems.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, can be used to generate a circuit pattern to be formed on an individual layer of the IC. This pattern can be transferred onto a target portion (e.g., comprising part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the target portions parallel or anti-parallel to this scanning direction. It is also possible to transfer the pattern from the patterning device to the substrate by imprinting the pattern onto the substrate.

During lithographic operation, different processing steps may require different layers to be sequentially formed on the substrate. Accordingly, it can be necessary to position the substrate relative to prior patterns formed thereon with a high degree of accuracy. Generally, alignment marks are placed on the substrate to be aligned and are located with reference to a second object. A lithographic apparatus may use an alignment apparatus for detecting positions of the alignment marks and for aligning the substrate using the alignment marks to ensure accurate exposure from a mask. Misalignment between the alignment marks at two different layers is measured as overlay error.

In order to monitor the lithographic process, parameters of the patterned substrate are measured. Parameters may include, for example, the overlay error between successive layers formed in or on the patterned substrate and critical linewidth of developed photosensitive resist. This measurement can be performed on a product substrate and/or on a dedicated metrology target. There are various techniques for making measurements of the microscopic structures formed in lithographic processes, including the use of scanning electron microscopes and various specialized tools. A fast and non-invasive form of a specialized inspection tool is a scatterometer in which a beam of radiation is directed onto a target on the surface of the substrate and properties of the scattered or reflected beam are measured. By comparing the properties of the beam before and after it has been reflected or scattered by the substrate, the properties of the substrate can be determined. This can be done, for example, by comparing the reflected beam with data stored in a library of known measurements associated with known substrate properties. Spectroscopic scatterometers direct a broadband radiation beam onto the substrate and measure the spectrum (intensity as a function of wavelength) of the radiation scattered into a particular narrow angular range. By contrast, angularly resolved scatterometers use a monochromatic radiation beam and measure the intensity of the scattered radiation as a function of angle.

Such optical scatterometers can be used to measure parameters, such as critical dimensions of developed photosensitive resist or overlay error (OV) between two layers formed in or on the patterned substrate. Properties of the substrate can be determined by comparing the properties of an illumination beam before and after the beam has been reflected or scattered by the substrate.

For properly aligning wafers to receive a pattern transfer in a way that mitigates OV, alignment metrology systems may be used in lithographic tools. A metrology system is typically programmed with certain assumptions regarding an alignment mark to be measured. For example, the metrology system may be programmed to expect diffracted radiation scattered by a grating pattern of the alignment mark. However, an unideal grating may diffract radiation in a different manner from an ideal grating, causing a metrology system to develop an error in its measurement result.

SUMMARY

Accordingly, it is desirable to improve accuracy and reduce errors in metrology tools used in conjunction with lithographic apparatuses.

In some embodiments, a metrology system comprises a beam splitter and first and second sensors. The beam splitter is configured to split radiation scattered by a target into first and second portions of radiation. The first sensor is configured to receive the first portion. The second sensor is configured to receive the second portion after the second portion propagates along a path that includes a wedge system comprising a first wedge configured to diverge the second portion.

In some embodiments, a lithographic apparatus comprises an illumination system, a projection system, and a metrology system. The metrology system comprises a beam splitter and first and second sensors. The illumination system illuminates a pattern of a patterning device. The projection system projects an image of the pattern onto a substrate. The beam splitter is configured to split radiation scattered by a target into first and second portions of radiation. The first sensor is configured to receive the first portion. The second sensor is configured to receive the second portion after the second portion propagates along a path that includes a wedge system comprising a first wedge configured to diverge the second portion.

In some embodiments, a method comprises splitting scattered radiation scattered by a target into first and second portions of radiation. The method further comprises receiving the first portion at a first sensor. The method further comprises receiving the second portion at a second sensor after the second portion propagates along a path that includes a wedge system comprising a first wedge. The method further comprises diverging the second portion using the first wedge.

Further features of the present disclosure, as well as the structure and operation of various embodiments, are described in detail below with reference to the accompanying drawings. It is noted that the present disclosure is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present disclosure and, together with the description, further serve to explain the principles of the present disclosure and to enable a person skilled in the relevant art(s) to make and use embodiments described herein.

Figure 1A:
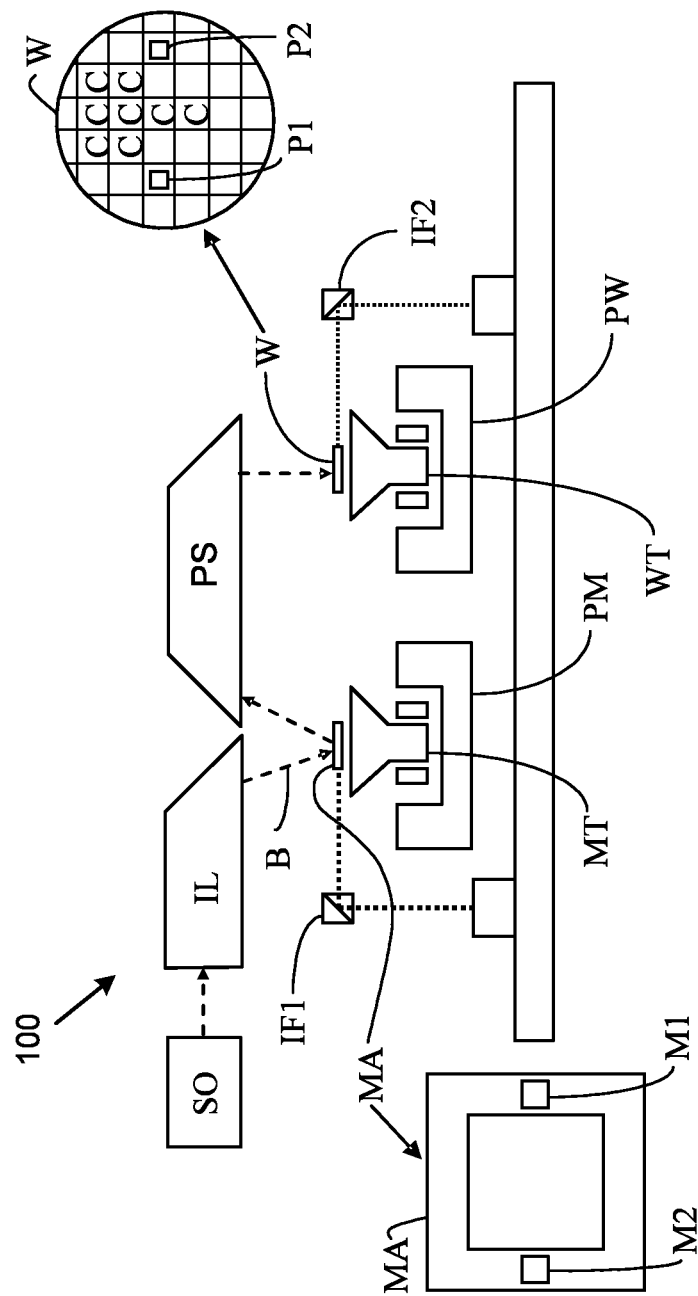
FIG. 1A shows a schematic of a reflective lithographic apparatus, according to some embodiments.

The features of the present disclosure will become more apparent from the detailed description set forth below when taken in conjunction with the drawings, in which like reference characters identify corresponding elements throughout. In the drawings, like reference numbers generally indicate identical, functionally similar, and/or structurally similar elements. Additionally, generally, the left-most digit(s) of a reference number identifies the drawing in which the reference number first appears. Unless otherwise indicated, the drawings provided throughout the disclosure should not be interpreted as to-scale drawings.

DETAILED DESCRIPTION

This specification discloses one or more embodiments that incorporate the features of the present disclosure. The disclosed embodiment(s) are provided as examples. The scope of the present disclosure is not limited to the disclosed embodiment(s). Claimed features are defined by the claims appended hereto.

The embodiment(s) described, and references in the specification to "one embodiment," "an embodiment," "an example embodiment," etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Spatially relative terms, such as "beneath," "below," "lower," "above," "on," "upper" and the like, can be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus can be otherwise oriented (rotated 90 degrees or at other orientations) and the spatially relative descriptors used herein may likewise be interpreted accordingly.

The term "about" as used herein indicates the value of a given quantity that can vary based on a particular technology. Based on the particular technology, the term "about" can indicate a value of a given quantity that varies within, for example, 10-30% of the value (e.g., ±10%, ±20%, or ±30% of the value).

Embodiments of the disclosure can be implemented in hardware, firmware, software, or any combination thereof. Embodiments of the disclosure may also be implemented as instructions stored on a machine-readable medium, which can be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, and/or instructions can be described herein as performing certain actions. However, it should be appreciated that such descriptions are merely for convenience and that such actions in fact result from computing devices, processors, controllers, or other devices executing the firmware, software, routines, instructions, etc.

Before describing such embodiments in more detail, however, it is instructive to present an example environment in which embodiments of the present disclosure can be implemented.

Example Lithographic Systems

Figure 1B:
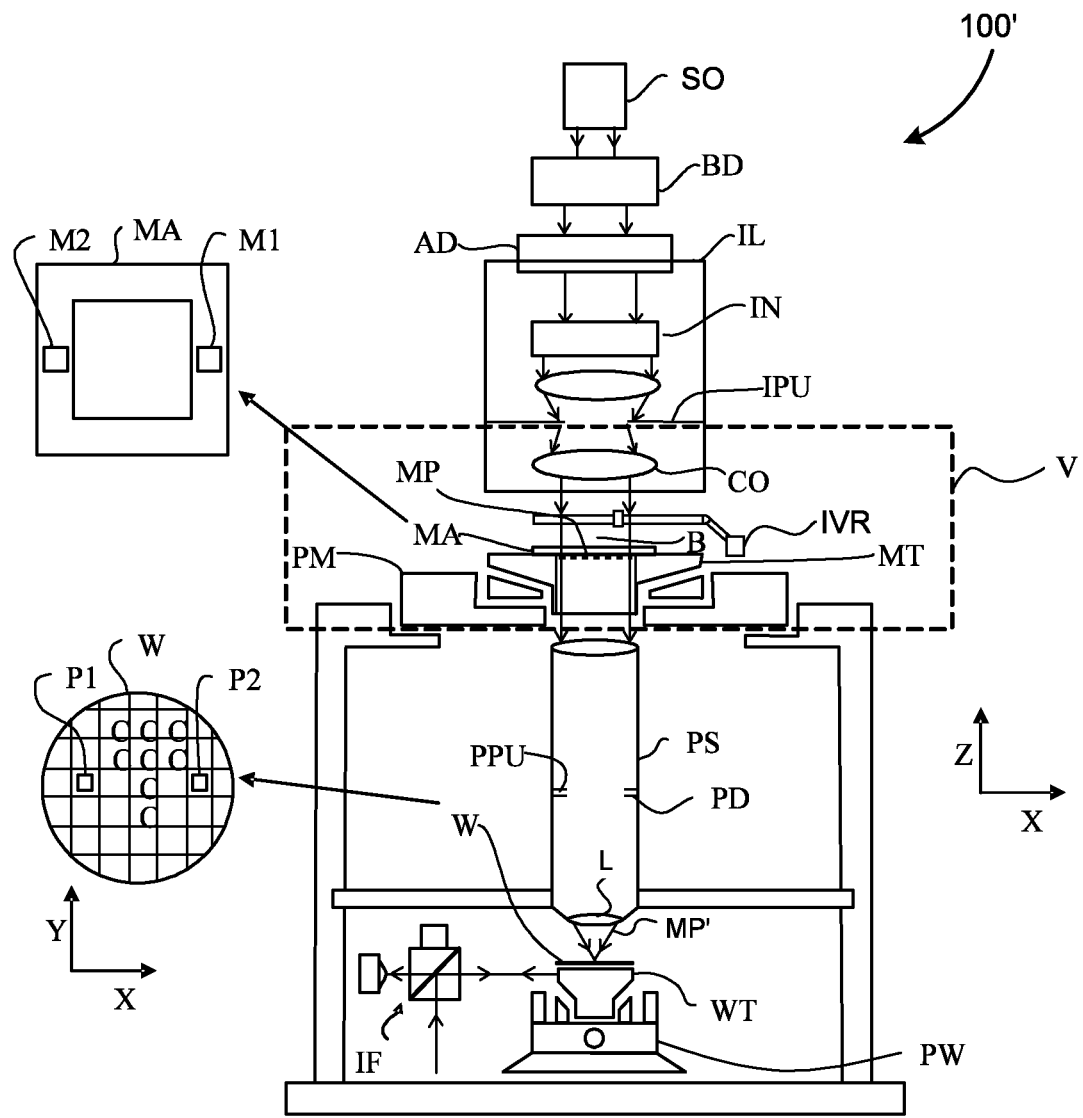
FIG. 1B shows a schematic of a transmissive lithographic apparatus, according to some embodiments.

FIGS. 1A and 1B show schematic illustrations of a lithographic apparatus 100 and lithographic apparatus 100', respectively, in which embodiments of the present disclosure may be implemented. Lithographic apparatus 100 and lithographic apparatus 100' each include the following: an illumination system (illuminator) IL configured to condition a radiation beam B (for example, deep ultra violet or extreme ultra violet radiation); a support structure (for example, a mask table) MT configured to support a patterning device (for example, a mask, a reticle, or a dynamic patterning device) MA and connected to a first positioner PM configured to accurately position the patterning device MA; and, a substrate table (for example, a wafer table) WT configured to hold a substrate (for example, a resist coated wafer) W and connected to a second positioner PW configured to accurately position the substrate W. Lithographic apparatus 100 and 100' also have a projection system PS configured to project a pattern imparted to the radiation beam B by patterning device MA onto a target portion (for example, comprising one or more dies) C of the substrate W. In lithographic apparatus 100, the patterning device MA and the projection system PS are reflective. In lithographic apparatus 100', the patterning device MA and the projection system PS are transmissive.

The illumination system IL may include various types of optical components, such as refractive, reflective, catadioptric, magnetic, electromagnetic, electrostatic, or other types of optical components, or any combination thereof, for directing, shaping, or controlling the radiation beam B.

The support structure MT holds the patterning device MA in a manner that depends on the orientation of the patterning device MA with respect to a reference frame, the design of at least one of the lithographic apparatus 100 and 100', and other conditions, such as whether or not the patterning device MA is held in a vacuum environment. The support structure MT may use mechanical, vacuum, electrostatic, or other clamping techniques to hold the patterning device MA. The support structure MT may be a frame or a table, for example, which may be fixed or movable, as required. By using sensors, the support structure MT may ensure that the patterning device MA is at a desired position, for example, with respect to the projection system PS.

The term "patterning device" MA should be broadly interpreted as referring to any device that may be used to impart a radiation beam B with a pattern in its cross-section, such as to create a pattern in the target portion C of the substrate W. The pattern imparted to the radiation beam B may correspond to a particular functional layer in a device being created in the target portion C to form an integrated circuit.

The terms "inspection apparatus," "metrology apparatus," and the like may be used herein to refer to, e.g., a device or system used for measuring a property of a structure (e.g., overlay error, critical dimension parameters) or used in a lithographic apparatus to inspect an alignment of a wafer (e.g., alignment apparatus).

The patterning device MA may be transmissive (as in lithographic apparatus 100' of FIG. 1B) or reflective (as in lithographic apparatus 100 of FIG. 1A). Examples of patterning devices MA include reticles, masks, programmable mirror arrays, or programmable LCD panels. Masks are well known in lithography, and include mask types such as binary, alternating phase shift, or attenuated phase shift, as well as various hybrid mask types. An example of a programmable mirror array employs a matrix arrangement of small mirrors, each of which may be individually tilted so as to reflect an incoming radiation beam in different directions. The tilted mirrors impart a pattern in the radiation beam B, which is reflected by a matrix of small mirrors.

The term "projection system" PS may encompass any type of projection system, including refractive, reflective, catadioptric, magnetic, electromagnetic and electrostatic optical systems, or any combination thereof, as appropriate for the exposure radiation being used, or for other factors, such as the use of an immersion liquid on the substrate W or the use of a vacuum. A vacuum environment may be used for EUV or electron beam radiation since other gases may absorb too much radiation or electrons. A vacuum environment may therefore be provided to the whole beam path with the aid of a vacuum wall and vacuum pumps.

Lithographic apparatus 100 and/or lithographic apparatus 100' may be of a type having two (dual stage) or more substrate tables WT (and/or two or more mask tables). In such "multiple stage" machines, the additional substrate tables WT may be used in parallel, or preparatory steps may be carried out on one or more tables while one or more other substrate tables WT are being used for exposure. In some situations, the additional table may not be a substrate table WT.

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIGS. 1A and 1B, the illuminator IL receives a radiation beam from a radiation source SO. The source SO and the lithographic apparatus 100, 100' may be separate physical entities, for example, when the source SO is an excimer laser. In such cases, the source SO is not considered to form part of the lithographic apparatus 100 or 100', and the radiation beam B passes from the source SO to the illuminator IL with the aid of a beam delivery system BD (in FIG. 1B) including, for example, suitable directing mirrors and/or a beam expander. In other cases, the source SO may be an integral part of the lithographic apparatus 100, 100', for example, when the source SO is a mercury lamp. The source SO and the illuminator IL, together with the beam delivery system BD, if required, may be referred to as a radiation system.

The illuminator IL may include an adjuster AD (in FIG. 1B) for adjusting the angular intensity distribution of the radiation beam. Generally, at least the outer and/or inner radial extent (commonly referred to as "σ-outer" and "σ-inner," respectively) of the intensity distribution in a pupil plane of the illuminator may be adjusted. In addition, the illuminator IL may comprise various other components (in FIG. 1B), such as an integrator IN and a condenser CO. The illuminator IL may be used to condition the radiation beam B to have a desired uniformity and intensity distribution in its cross section.

Referring to FIG. 1A, the radiation beam B is incident on the patterning device (for example, mask) MA, which is held on the support structure (for example, mask table) MT, and is patterned by the patterning device MA. In lithographic apparatus 100, the radiation beam B is reflected from the patterning device (for example, mask) MA. After being reflected from the patterning device (for example, mask) MA, the radiation beam B passes through the projection system PS, which focuses the radiation beam B onto a target portion C of the substrate W. With the aid of the second positioner PW and position sensor IF2 (for example, an interferometric device, linear encoder, or capacitive sensor), the substrate table WT may be moved accurately (for example, so as to position different target portions C in the path of the radiation beam B). Similarly, the first positioner PM and another position sensor IF1 may be used to accurately position the patterning device (for example, mask) MA with respect to the path of the radiation beam B. Patterning device (for example, mask) MA and substrate W may be aligned using mask alignment marks M1, M2 and substrate alignment marks P1, P2.

Referring to FIG. 1B, the radiation beam B is incident on the patterning device (for example, mask MA), which is held on the support structure (for example, mask table MT), and is patterned by the patterning device. Having traversed the mask MA, the radiation beam B passes through the projection system PS, which focuses the beam onto a target portion C of the substrate W. The projection system has a pupil conjugate PPU to an illumination system pupil IPU. Portions of radiation emanate from the intensity distribution at the illumination system pupil IPU and traverse a mask pattern without being affected by diffraction at the mask pattern and create an image of the intensity distribution at the illumination system pupil IPU.

The projection system PS projects an image of the mask pattern MP, where the image is formed by diffracted beams produced from the mark pattern MP by radiation from the intensity distribution, onto a photoresist layer coated on the substrate W. For example, the mask pattern MP may include an array of lines and spaces. A diffraction of radiation at the array and different from zeroth order diffraction generates diverted diffracted beams with a change of direction in a direction perpendicular to the lines. Undiffracted beams (i.e., so-called zeroth order diffracted beams) traverse the pattern without any change in propagation direction. The zeroth order diffracted beams traverse an upper lens or upper lens group of the projection system PS, upstream of the pupil conjugate PPU of the projection system PS, to reach the pupil conjugate PPU. The portion of the intensity distribution in the plane of the pupil conjugate PPU and associated with the zeroth order diffracted beams is an image of the intensity distribution in the illumination system pupil IPU of the illumination system IL. The aperture device PD, for example, is disposed at or substantially at a plane that includes the pupil conjugate PPU of the projection system PS.

The projection system PS is arranged to capture, by means of a lens or lens group L, not only the zeroth order diffracted beams, but also first-order or first- and higher-order diffracted beams (not shown). In some embodiments, dipole illumination for imaging line patterns extending in a direction perpendicular to a line may be used to utilize the resolution enhancement effect of dipole illumination. For example, first-order diffracted beams interfere with corresponding zeroth-order diffracted beams at the level of the wafer W to create an image of the line pattern MP at highest possible resolution and process window (i.e., usable depth of focus in combination with tolerable exposure dose deviations). In some embodiments, astigmatism aberration may be reduced by providing radiation poles (not shown) in opposite quadrants of the illumination system pupil IPU. Further, in some embodiments, astigmatism aberration may be reduced by blocking the zeroth order beams in the pupil conjugate PPU of the projection system associated with radiation poles in opposite quadrants. This is described in more detail in U.S. Pat. No. 7,511,799 B2, issued Mar. 31, 2009, which is incorporated by reference herein in its entirety.

With the aid of the second positioner PW and position sensor IF (for example, an interferometric device, linear encoder, or capacitive sensor), the substrate table WT may be moved accurately (for example, so as to position different target portions C in the path of the radiation beam B). Similarly, the first positioner PM and another position sensor IF1 (not shown in FIG. 1B) may be used to accurately position the mask MA with respect to the path of the radiation beam B (for example, after mechanical retrieval from a mask library or during a scan).

In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner), the mask table MT may be connected to a short-stroke actuator only or may be fixed. Mask MA and substrate W may be aligned using mask alignment marks M1, M2, and substrate alignment marks P1, P2. Although the substrate alignment marks (as illustrated) occupy dedicated target portions, they may be located in spaces between target portions (known as scribe-lane alignment marks). Similarly, in situations in which more than one die is provided on the mask MA, the mask alignment marks may be located between the dies.

Mask table MT and patterning device MA may be in a vacuum chamber V, where an in-vacuum robot IVR may be used to move patterning devices such as a mask in and out of vacuum chamber. Alternatively, when mask table MT and patterning device MA are outside of the vacuum chamber, an out-of-vacuum robot may be used for various transportation operations, similar to the in-vacuum robot IVR. Both the in-vacuum and out-of-vacuum robots need to be calibrated for a smooth transfer of any payload (e.g., mask) to a fixed kinematic mount of a transfer station.

The lithographic apparatus 100 and 100' may be used in at least one of the following modes:

1. In step mode, the support structure (for example, mask table) MT and the substrate table WT are kept essentially stationary, while an entire pattern imparted to the radiation beam B is projected onto a target portion C at one time (i.e., a single static exposure). The substrate table WT is then shifted in the X and/or Y direction so that a different target portion C may be exposed.
2. In scan mode, the support structure (for example, mask table) MT and the substrate table WT are scanned synchronously while a pattern imparted to the radiation beam B is projected onto a target portion C (i.e., a single dynamic exposure). The velocity and direction of the substrate table WT relative to the support structure (for example, mask table) MT may be determined by the (de-)magnification and image reversal characteristics of the projection system PS.
3. In another mode, the support structure (for example, mask table) MT is kept substantially stationary holding a programmable patterning device, and the substrate table WT is moved or scanned while a pattern imparted to the radiation beam B is projected onto a target portion C. A pulsed radiation source SO may be employed and the programmable patterning device is updated as required after each movement of the substrate table WT or in between successive radiation pulses during a scan. This mode of operation may be readily applied to maskless lithography that utilizes a programmable patterning device, such as a programmable mirror array.

Combinations and/or variations on the described modes of use or entirely different modes of use may also be employed.

In a further embodiment, lithographic apparatus 100 includes an extreme ultraviolet (EUV) source, which is configured to generate a beam of EUV radiation for EUV lithography. In general, the EUV source is configured in a radiation system, and a corresponding illumination system is configured to condition the EUV radiation beam of the EUV source.

Figure 2:
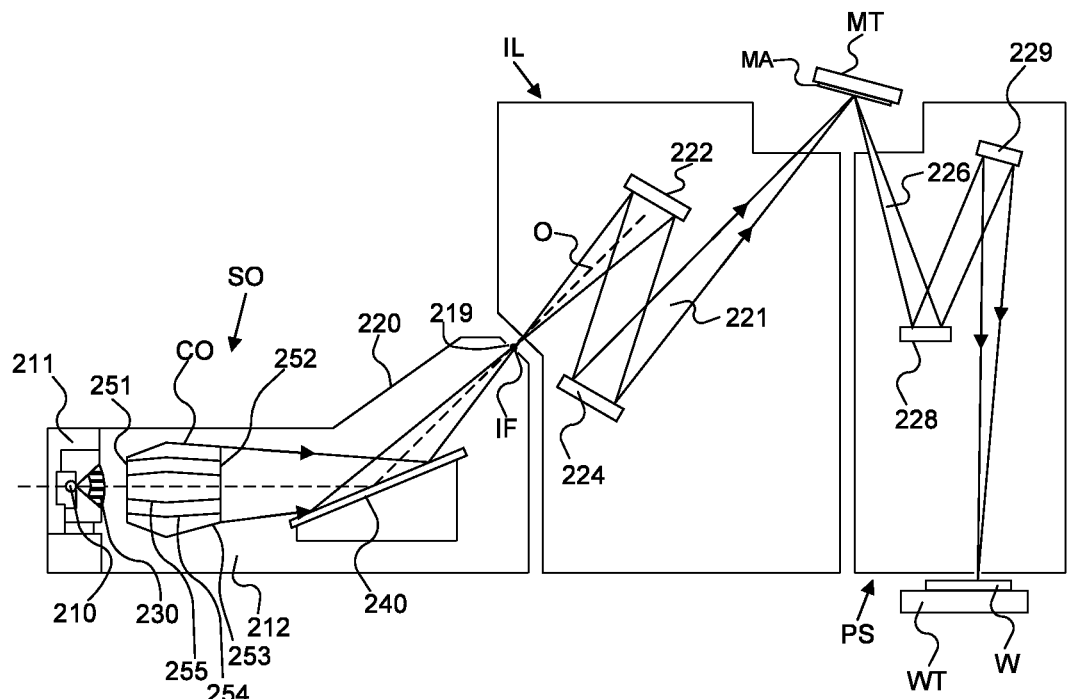
FIG. 2 shows a more detailed schematic of the reflective lithographic apparatus, according to some embodiments.

FIG. 2 shows the lithographic apparatus 100 in more detail, including the source collector apparatus SO, the illumination system IL, and the projection system PS. The source collector apparatus SO is constructed and arranged such that a vacuum environment may be maintained in an enclosing structure 220 of the source collector apparatus SO. An EUV radiation emitting plasma 210 may be formed by a discharge produced plasma source. EUV radiation may be produced by a gas or vapor, for example Xe gas, Li vapor, or Sn vapor in which the very hot plasma 210 is created to emit radiation in the EUV range of the electromagnetic spectrum. The very hot plasma 210 is created by, for example, an electrical discharge causing at least a partially ionized plasma. Partial pressures of, for example, 10 Pa of Xe, Li, Sn vapor, or any other suitable gas or vapor may be required for efficient generation of the radiation. In some embodiments, a plasma of excited tin (Sn) is provided to produce EUV radiation.

The radiation emitted by the hot plasma 210 is passed from a source chamber 211 into a collector chamber 212 via an optional gas barrier or contaminant trap 230 (in some cases also referred to as contaminant barrier or foil trap), which is positioned in or behind an opening in source chamber 211. The contaminant trap 230 may include a channel structure. Contamination trap 230 may also include a gas barrier or a combination of a gas barrier and a channel structure. The contaminant trap or contaminant barrier 230 further indicated herein at least includes a channel structure.

The collector chamber 212 may include a radiation collector CO, which may be a so-called grazing incidence collector. Radiation collector CO has an upstream radiation collector side 251 and a downstream radiation collector side 252. Radiation that traverses collector CO may be reflected off a grating spectral filter 240 to be focused in a virtual source point IF. The virtual source point IF is commonly referred to as the intermediate focus, and the source collector apparatus is arranged such that the intermediate focus IF is located at or near an opening 219 in the enclosing structure 220. The virtual source point IF is an image of the radiation emitting plasma 210. Grating spectral filter 240 is used in particular for suppressing infra-red (IR) radiation.

Subsequently the radiation traverses the illumination system IL, which may include a faceted field mirror device 222 and a faceted pupil mirror device 224 arranged to provide a desired angular distribution of the radiation beam 221, at the patterning device MA, as well as a desired uniformity of radiation intensity at the patterning device MA. Upon reflection of the beam of radiation 221 at the patterning device MA, held by the support structure MT, a patterned beam 226 is formed and the patterned beam 226 is imaged by the projection system PS via reflective elements 228, 229 onto a substrate W held by the wafer stage or substrate table WT.

More elements than shown may generally be present in illumination optics unit IL and projection system PS. The grating spectral filter 240 may optionally be present, depending upon the type of lithographic apparatus. Further, there may be more mirrors present than those shown in the FIG. 2, for example there may be one to six additional reflective elements present in the projection system PS than shown in FIG. 2.

Collector optic CO, as illustrated in FIG. 2, is depicted as a nested collector with grazing incidence reflectors 253, 254, and 255, just as an example of a collector (or collector mirror). The grazing incidence reflectors 253, 254, and 255 are disposed axially symmetric around an optical axis O and a collector optic CO of this type is preferably used in combination with a discharge produced plasma source, often called a DPP source.

Exemplary Lithographic Cell

Figure 3:
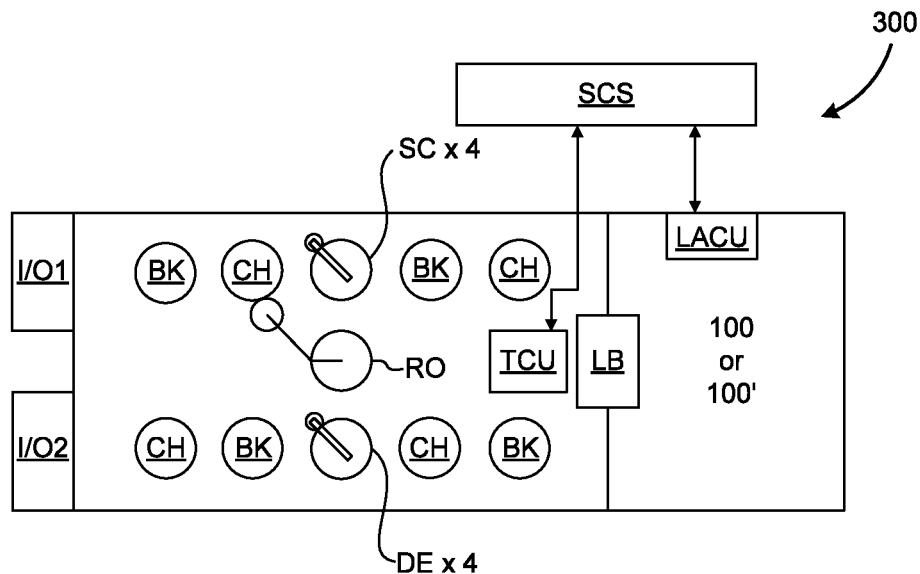
FIG. 3 shows a schematic of a lithographic cell, according to some embodiments.

FIG. 3 shows a lithographic cell 300, also sometimes referred to a lithocell or cluster, according to some embodiments. Lithographic apparatus 100 or 100' may form part of lithographic cell 300. Lithographic cell 300 may also include one or more apparatuses to perform pre- and post-exposure processes on a substrate. Conventionally these include spin coaters SC to deposit resist layers, developers DE to develop exposed resist, chill plates CH, and bake plates BK. A substrate handler, or robot, RO picks up substrates from input/output ports I/O1, 1/O2, moves them between the different process apparatuses and delivers them to the loading bay LB of the lithographic apparatus 100 or 100'. These devices, which are often collectively referred to as the track, are under the control of a track control unit TCU, which is itself controlled by a supervisory control system SCS, which also controls the lithographic apparatus via lithography control unit LACU. Thus, the different apparatuses may be operated to maximize throughput and processing efficiency.

Exemplary Inspection Apparatus

In order to control the lithographic process to place device features accurately on the substrate, alignment marks are generally provided on the substrate, and the lithographic apparatus includes one or more alignment apparatuses and/or systems by which positions of marks on a substrate must be measured accurately. These alignment apparatuses are effectively position measuring apparatuses. Different types of marks and different types of alignment apparatuses and/or systems are known from different times and different manufacturers. A type of system widely used in current lithographic apparatus is based on a self-referencing interferometer as described in U.S. Pat. No. 6,961,116 (den Boef et al.). Generally marks are measured separately to obtain X- and Y-positions. A combined X- and Y-measurement may be performed using the techniques described in U.S. Publication No. 2009/195768 A (Bijnen et al.), however. The full contents of both of these disclosures are incorporated herein by reference.

Figure 4A:
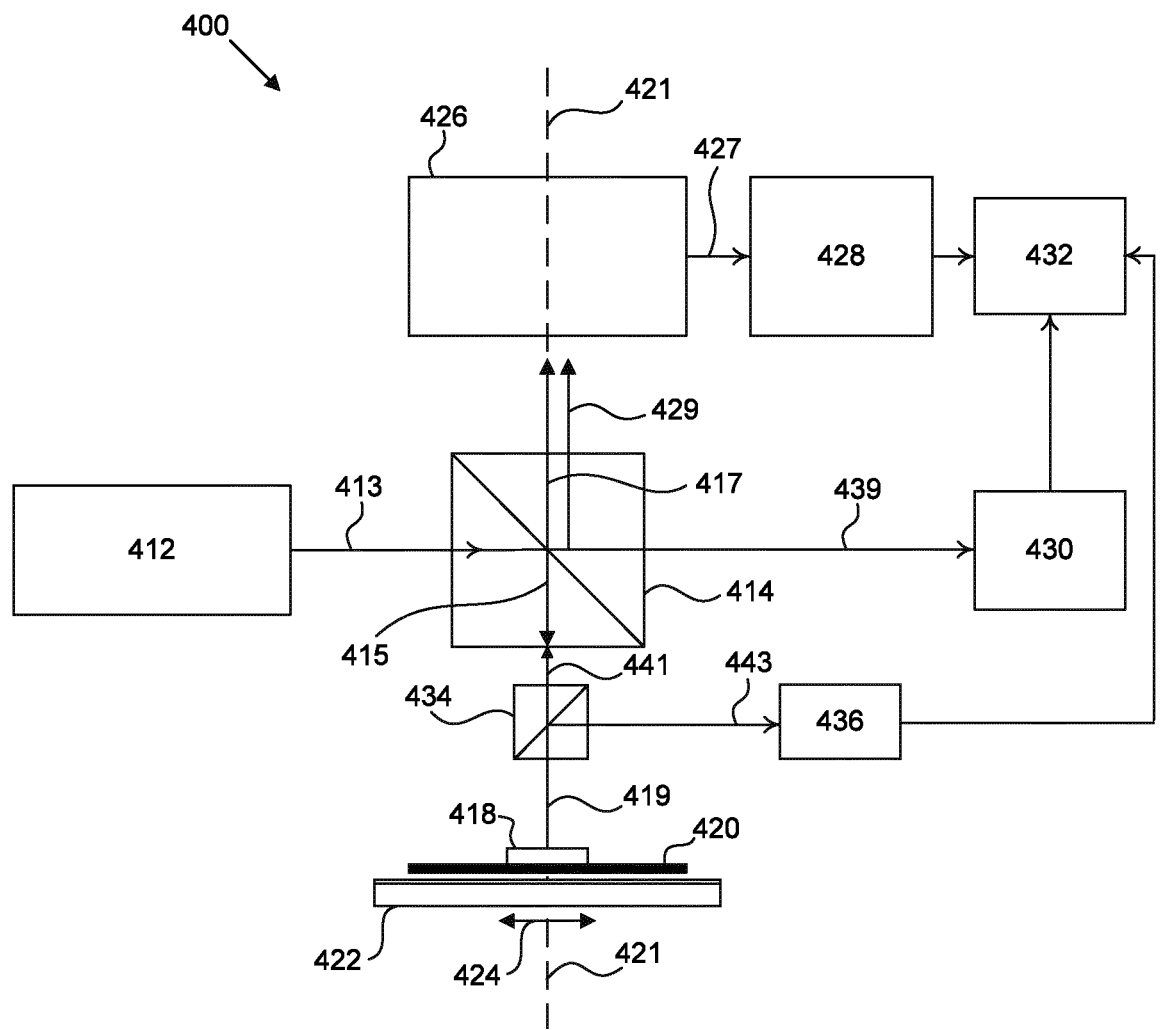
FIGS. 4A and 4B show schematics of inspection apparatuses, according to some embodiments.

FIG. 4A shows a schematic of a cross-sectional view of an inspection apparatus 400 that may be implemented as a part of lithographic apparatus 100 or 100', according to some embodiments. In some embodiments, inspection apparatus 400 may be configured to align a substrate (e.g., substrate W) with respect to a patterning device (e.g., patterning device MA). Inspection apparatus 400 may be further configured to detect positions of alignment marks on the substrate and to align the substrate with respect to the patterning device or other components of lithographic apparatus 100 or 100' using the detected positions of the alignment marks. Such alignment of the substrate may ensure accurate exposure of one or more patterns on the substrate.

In some embodiments, inspection apparatus 400 may include an illumination system 412, a beam splitter 414, an interferometer 426, a detector 428, a beam analyzer 430, and an overlay calculation processor 432. Illumination system 412 may be configured to provide an electromagnetic narrow band radiation beam 413 having one or more passbands. In an example, the one or more passbands may be within a spectrum of wavelengths between about 500 nm to about 900 nm. In another example, the one or more passbands may be discrete narrow passbands within a spectrum of wavelengths between about 500 nm to about 900 nm. Illumination system 412 may be further configured to provide one or more passbands having substantially constant center wavelength (CWL) values over a long period of time (e.g., over a lifetime of illumination system 412). Such configuration of illumination system 412 may help to prevent the shift of the actual CWL values from the desired CWL values, as discussed above, in current alignment systems. And, as a result, the use of constant CWL values may improve long-term stability and accuracy of alignment systems (e.g., inspection apparatus 400) compared to the current alignment apparatuses.

In some embodiments, beam splitter 414 may be configured to receive radiation beam 413 and split radiation beam 413 into at least two radiation sub-beams. For example, radiation beam 413 may be split into radiation sub-beams 415 and 417, as shown in FIG. 4A. Beam splitter 414 may be further configured to direct radiation sub-beam 415 onto a substrate 420 placed on a stage 422. In one example, the stage 422 is movable along direction 424. Radiation sub-beam 415 may be configured to illuminate an alignment mark or a target 418 located on substrate 420. Alignment mark or target 418 may be coated with a radiation sensitive film. In some embodiments, alignment mark or target 418 may have one hundred and eighty degrees (i.e., 180°) symmetry. That is, when alignment mark or target 418 is rotated 180° about an axis of symmetry perpendicular to a plane of alignment mark or target 418, rotated alignment mark or target 418 may be substantially identical to an unrotated alignment mark or target 418. The target 418 on substrate 420 may be (a) a resist layer grating comprising bars that are formed of solid resist lines, or (b) a product layer grating, or (c) a composite grating stack in an overlay target structure comprising a resist grating overlaid or interleaved on a product layer grating. The bars may alternatively be etched into the substrate. This pattern is sensitive to chromatic aberrations in the lithographic projection apparatus, particularly the projection system PL, and illumination symmetry and the presence of such aberrations will manifest themselves in a variation in the printed grating. One in-line method used in device manufacturing for measurements of line width, pitch, and critical dimension makes use of a technique known as "scatterometry". Methods of scatterometry are described in Raymond et al., "Multiparameter Grating Metrology Using Optical Scatterometry", J. Vac. Sci. Tech. B, Vol. 15, no. 2, pp. 361-368 (1997) and Niu et al., "Specular Spectroscopic Scatterometry in DUV Lithography", SPIE, Vol. 3677 (1999), which are both incorporated by reference herein in their entireties. In scatterometry, light is reflected by periodic structures in the target, and the resulting reflection spectrum at a given angle is detected. The structure giving rise to the reflection spectrum is reconstructed, e.g. using Rigorous Coupled-Wave Analysis (RCWA) or by comparison to a library of patterns derived by simulation. Accordingly, the scatterometry data of the printed gratings is used to reconstruct the gratings. The parameters of the grating, such as line widths and shapes, may be input to the reconstruction process, performed by processing unit PU, from knowledge of the printing step and/or other scatterometry processes.

In some embodiments, beam splitter 414 may be further configured to receive diffraction radiation beam 419 and split diffraction radiation beam 419 into at least two radiation sub-beams, according to an embodiment. Diffraction radiation beam 419 may be split into diffraction radiation sub-beams 429 and 439, as shown in FIG. 4A.

It should be noted that even though beam splitter 414 is shown to direct radiation sub-beam 415 towards alignment mark or target 418 and to direct diffracted radiation sub-beam 429 towards interferometer 426, the disclosure is not so limiting. It would be apparent to a person skilled in the relevant art that other optical arrangements may be used to obtain the similar result of illuminating alignment mark or target 418 on substrate 420 and detecting an image of alignment mark or target 418.

As illustrated in FIG. 4A, interferometer 426 may be configured to receive radiation sub-beam 417 and diffracted radiation sub-beam 429 through beam splitter 414. In an example embodiment, diffracted radiation sub-beam 429 may be at least a portion of radiation sub-beam 415 that may be reflected from alignment mark or target 418. In an example of this embodiment, interferometer 426 comprises any appropriate set of optical-elements, for example, a combination of prisms that may be configured to form two images of alignment mark or target 418 based on the received diffracted radiation sub-beam 429. It should be appreciated that a good quality image need not be formed, but that the features of alignment mark 418 should be resolved. Interferometer 426 may be further configured to rotate one of the two images with respect to the other of the two images 180° and recombine the rotated and unrotated images interferometrically.

In some embodiments, detector 428 may be configured to receive the recombined image via interferometer signal 427 and detect interference as a result of the recombined image when alignment axis 421 of inspection apparatus 400 passes through a center of symmetry (not shown) of alignment mark or target 418. Such interference may be due to alignment mark or target 418 being 180° symmetrical, and the recombined image interfering constructively or destructively, according to an example embodiment. Based on the detected interference, detector 428 may be further configured to determine a position of the center of symmetry of alignment mark or target 418 and consequently, detect a position of substrate 420. According to an example, alignment axis 421 may be aligned with an optical beam perpendicular to substrate 420 and passing through a center of image rotation interferometer 426. Detector 428 may be further configured to estimate the positions of alignment mark or target 418 by implementing sensor characteristics and interacting with wafer mark process variations.

In a further embodiment, detector 428 determines the position of the center of symmetry of alignment mark or target 418 by performing one or more of the following measurements:

1. measuring position variations for various wavelengths (position shift between colors);
2. measuring position variations for various orders (position shift between diffraction orders); and
3. measuring position variations for various polarizations (position shift between polarizations).

This data may, for example, be obtained with any type of alignment sensor, for example a SMASH (SMart Alignment Sensor Hybrid) sensor, as described in U.S. Pat. No. 6,961, 116 that employs a self-referencing interferometer with a single detector and four different wavelengths, and extracts the alignment signal in software, or Athena (Advanced Technology using High order ENhancement of Alignment), as described in U.S. Pat. No. 6,297,876, which directs each of seven diffraction orders to a dedicated detector, which are both incorporated by reference herein in their entireties.

In some embodiments, beam analyzer 430 may be configured to receive and determine an optical state of diffracted radiation sub-beam 439. The optical state may be a measure of beam wavelength, polarization, or beam profile. Beam analyzer 430 may be further configured to determine a position of stage 422 and correlate the position of stage 422 with the position of the center of symmetry of alignment mark or target 418. As such, the position of alignment mark or target 418 and, consequently, the position of substrate 420 may be accurately known with reference to stage 422. Alternatively, beam analyzer 430 may be configured to determine a position of inspection apparatus 400 or any other reference element such that the center of symmetry of alignment mark or target 418 may be known with reference to inspection apparatus 400 or any other reference element. Beam analyzer 430 may be a point or an imaging polarimeter with some form of wavelength-band selectivity. In some embodiments, beam analyzer 430 may be directly integrated into inspection apparatus 400, or connected via fiber optics of several types: polarization preserving single mode, multimode, or imaging, according to other embodiments.

In some embodiments, beam analyzer 430 may be further configured to determine the overlay data between two patterns on substrate 420. One of these patterns may be a reference pattern on a reference layer. The other pattern may be an exposed pattern on an exposed layer. The reference layer may be an etched layer already present on substrate 420. The reference layer may be generated by a reference pattern exposed on the substrate by lithographic apparatus 100 and/or 100'. The exposed layer may be a resist layer exposed adjacent to the reference layer. The exposed layer may be generated by an exposure pattern exposed on substrate 420 by lithographic apparatus 100 or 100'. The exposed pattern on substrate 420 may correspond to a movement of substrate 420 by stage 422. In some embodiments, the measured overlay data may also indicate an offset between the reference pattern and the exposure pattern. The measured overlay data may be used as calibration data to calibrate the exposure pattern exposed by lithographic apparatus 100 or 100', such that after the calibration, the offset between the exposed layer and the reference layer may be minimized In some embodiments, beam analyzer 430 may be further configured to determine a model of the product stack profile of substrate 420, and may be configured to measure overlay, critical dimension, and focus of target 418 in a single measurement. The product stack profile contains information on the stacked product such as alignment mark, target 418, or substrate 420, and may include mark process variation-induced optical signature metrology that is a function of illumination variation. The product stack profile may also include product grating profile, mark stack profile, and mark asymmetry information. An example of beam analyzer 430 is Yieldstar™, manufactured by ASML, Veldhoven, The Netherlands, as described in U.S. Pat. No. 8,706,442, which is incorporated by reference herein in its entirety. Beam analyzer 430 may be further configured to process information related to a particular property of an exposed pattern in that layer. For example, beam analyzer 430 may process an overlay parameter (an indication of the positioning accuracy of the layer with respect to a previous layer on the substrate or the positioning accuracy of the first layer with respective to marks on the substrate), a focus parameter, and/or a critical dimension parameter (e.g., line width and its variations) of the depicted image in the layer. Other parameters are image parameters relating to the quality of the depicted image of the exposed pattern.

In some embodiments, an array of detectors (not shown) may be connected to beam analyzer 430, and allows the possibility of accurate stack profile detection as discussed below. For example, detector 428 may be an array of detectors. For the detector array, a number of options are possible: a bundle of multimode fibers, discrete pin detectors per channel, or CCD or CMOS (linear) arrays. The use of a bundle of multimode fibers enables any dissipating elements to be remotely located for stability reasons. Discrete PIN detectors offer a large dynamic range but each need separate pre-amps. The number of elements is therefore limited. CCD linear arrays offer many elements that may be read-out at high speed and are especially of interest if phase-stepping detection is used.

Figure 4B:
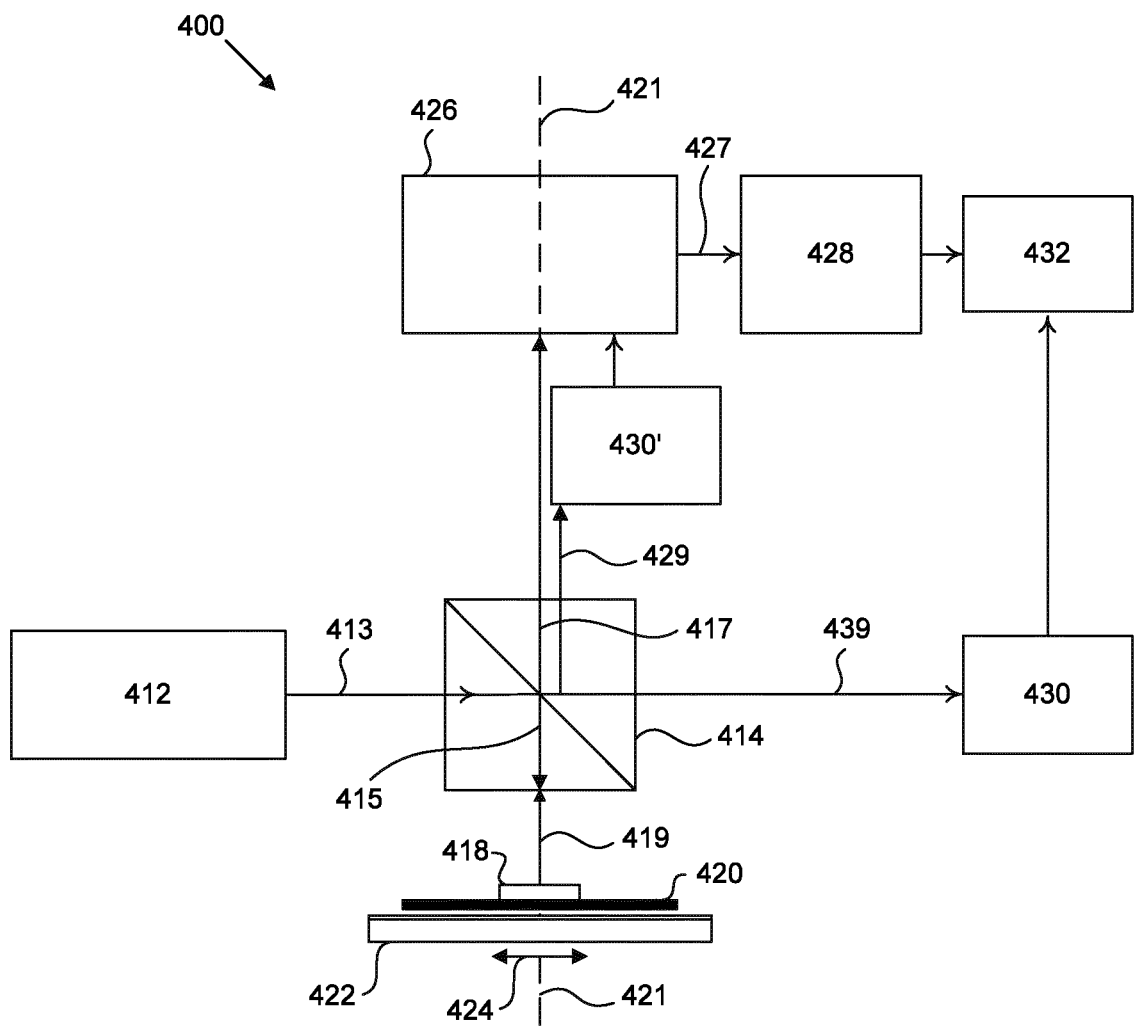

In some embodiments, a second beam analyzer 430' may be configured to receive and determine an optical state of diffracted radiation sub-beam 429, as shown in FIG. 4B. The optical state may be a measure of beam wavelength, polarization, or beam profile. Second beam analyzer 430' may be identical to beam analyzer 430. Alternatively, second beam analyzer 430' may be configured to perform at least all the functions of beam analyzer 430, such as determining a position of stage 422 and correlating the position of stage 422 with the position of the center of symmetry of alignment mark or target 418. As such, the position of alignment mark or target 418 and, consequently, the position of substrate 420, may be accurately known with reference to stage 422. Second beam analyzer 430' may also be configured to determine a position of inspection apparatus 400, or any other reference element, such that the center of symmetry of alignment mark or target 418 may be known with reference to inspection apparatus 400, or any other reference element. Second beam analyzer 430' may be further configured to determine the overlay data between two patterns and a model of the product stack profile of substrate 420. Second beam analyzer 430' may also be configured to measure overlay, critical dimension, and focus of target 418 in a single measurement.

In some embodiments, second beam analyzer 430' may be directly integrated into inspection apparatus 400, or it may be connected via fiber optics of several types: polarization preserving single mode, multimode, or imaging, according to other embodiments. Alternatively, second beam analyzer 430' and beam analyzer 430 may be combined to form a single analyzer (not shown) configured to receive and determine the optical states of both diffracted radiation sub-beams 429 and 439.

In some embodiments, processor 432 receives information from detector 428 and beam analyzer 430. For example, processor 432 may be an overlay calculation processor. The information may comprise a model of the product stack profile constructed by beam analyzer 430. Alternatively, processor 432 may construct a model of the product mark profile using the received information about the product mark. In either case, processor 432 constructs a model of the stacked product and overlay mark profile using or incorporating a model of the product mark profile. The stack model is then used to determine the overlay offset and minimizes the spectral effect on the overlay offset measurement. Processor 432 may create a basic correction algorithm based on the information received from detector 428 and beam analyzer 430, including but not limited to the optical state of the illumination beam, the alignment signals, associated position estimates, and the optical state in the pupil, image, and additional planes. The pupil plane is the plane in which the radial position of radiation defines the angle of incidence and the angular position defines the azimuth angle of the radiation. Processor 432 may utilize the basic correction algorithm to characterize the inspection apparatus 400 with reference to wafer marks and/or alignment marks 418.

In some embodiments, processor 432 may be further configured to determine printed pattern position offset error with respect to the sensor estimate for each mark based on the information received from detector 428 and beam analyzer 430. The information includes but is not limited to the product stack profile, measurements of overlay, critical dimension, and focus of each alignment marks or target 418 on substrate 420. Processor 432 may utilize a clustering algorithm to group the marks into sets of similar constant offset error, and create an alignment error offset correction table based on the information. The clustering algorithm may be based on overlay measurement, the position estimates, and additional optical stack process information associated with each set of offset errors. The overlay is calculated for a number of different marks, for example, overlay targets having a positive and a negative bias around a programmed overlay offset. The target that measures the smallest overlay is taken as reference (as it is measured with the best accuracy). From this measured small overlay, and the known programmed overlay of its corresponding target, the overlay error may be deduced. Table 1 illustrates how this may be performed. The smallest measured overlay in the example shown is −1 nm. However this is in relation to a target with a programmed overlay of −30 nm. Consequently the process must have introduced an overlay error of 29 nm.

TABLE 1

| Programmed overlay | −70 | −50 | −30 | −10 | 10 | 30 | 50 |
|---|---|---|---|---|---|---|---|
| Measured overlay | −38 | −19 | −1 | 21 | 43 | 66 | 90 |
| Difference between measured and programmed overlay | 32 | 31 | 29 | 31 | 33 | 36 | 40 |
| Overlay error | 3 | 2 | — | 2 | 4 | 7 | 11 |

The smallest value may be taken to be the reference point and, relative to this, the offset may be calculated between measured overlay and that expected due to the programmed overlay. This offset determines the overlay error for each mark or the sets of marks with similar offsets. Therefore, in the Table 1 example, the smallest measured overlay was −1 nm, at the target position with programmed overlay of 30 nm. The difference between the expected and measured overlay at the other targets is compared to this reference. A table such as Table 1 may also be obtained from marks and target 418 under different illumination settings, the illumination setting, which results in the smallest overlay error, and its corresponding calibration factor, may be determined and selected. Following this, processor 432 may group marks into sets of similar overlay error. The criteria for grouping marks may be adjusted based on different process controls, for example, different error tolerances for different processes.

In some embodiments, processor 432 may confirm that all or most members of the group have similar offset errors, and apply an individual offset correction from the clustering algorithm to each mark, based on its additional optical stack metrology. Processor 432 may determine corrections for each mark and feed the corrections back to lithographic apparatus 100 or 100' for correcting errors in the overlay, for example, by feeding corrections into the inspection apparatus 400.

Exemplary Characterization of Intensity Imbalance in a Metrology System

A metrology system (e.g., inspection apparatus 400) is typically programmed with certain assumptions regarding the target it is to measure. For example, the metrology system may be programmed to expect diffracted radiation scattered by a grating used as an alignment mark. An ideal grating may generate diffraction orders in a predictable manner Characteristics of the diffracted radiation (e.g., intensity in each diffraction order) may be analyzed by the metrology system in order to generate, for example, an alignment position of the grating. However, actual gratings on a wafer may depart from the ideal. For example, a wafer can have one or more gratings fabricated onto when undergoing a plurality of lithographic processes to form the different layers of lithographically fabricated devices. The processes may involve polishing and/or etching that distort, smear, or otherwise damage gratings that already exist on the wafer from a prior lithographic process. The damaged grating may then diffract metrology radiation in a different manner from an ideal grating, causing a metrology system to develop an error in its measurement result. For example, a damaged grating may cause an intensity imbalance between different diffraction orders, whereas the metrology system may be expecting perfectly balanced intensities based on an assumption that an ideal or near-perfect grating has been measured.

The present disclosure provides structures and functions of metrology system(s) for reducing or eliminating errors associated with metrology performed on damaged targets. However, before describing such embodiments in more detail, it is instructive to first discuss optics in metrology systems that embodiments of the present disclosure may depend upon.

Briefly referring back to FIG. 4A, metrology system 400 may comprise a beam splitter 434 and a sensor 436. Sensor 436 may be referred to as a second sensor, with detector 428 being the first sensor. Beam splitter 434 may receive diffraction radiation 419. Target 418 may interact with incident radiation via reflection, refraction, diffraction, scattering, or the like to generate scattered radiation (e.g., diffraction radiation 419). For ease of discussion, and without limitation, such radiation may be termed scattered radiation throughout. Beam splitter 434 may split the radiation scattered by target 418 into first portion of radiation 441 and second portion of radiation 443. First portion of radiation 441 may continue on (e.g., as sub-beam 429 then interferometer signal) for subsequent receipt detector 428. Subsequent determination of properties of target 418 (e.g., alignment position) may be performed as described above. Sensor 436 may be used to determine a corrections to the property determined via detector 428. Sensor 436 may work in conjunction with processor 432 to determine the correction. Though not shown in FIG. 4B, it should be understood that the structures and functions of beam splitter 434 and sensor 436 may be implemented in embodiments referencing FIG. 4B.

Figure 5:
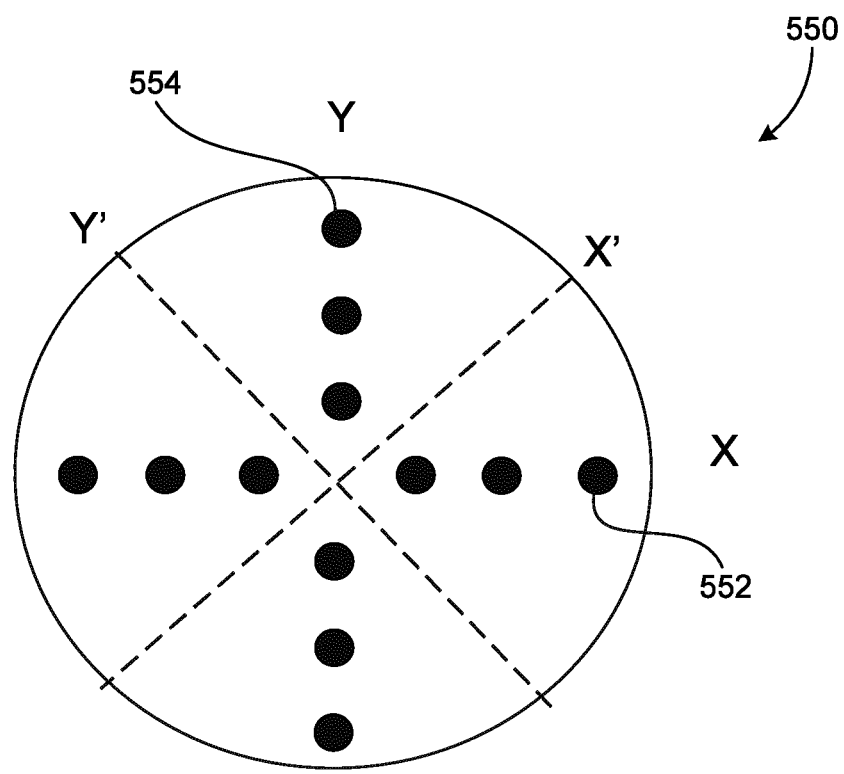
FIG. 5 shows a pupil in a metrology system, according to some embodiments.

FIG. 5 shows a pupil 550 in a metrology system (not shown), according to some embodiments. In some embodiments, the metrology system may be, for example, inspection apparatus 400 (FIGS. 4A and 4B). Pupil 550 may be at a plane through which diffracted radiation from a target passes through, for example, in the path of diffraction radiation 419 from target 418 (FIGS. 4A and 4B)). A target may have a combination of vertical and horizontal gratings that may generate a plurality of beams of radiation in pupil 550. The beams may have different diffraction orders. For example, there may be diffraction orders 552 (e.g., −n, . . . , −2, −1, 0, +1, +2, . . . , +n) arranged along a horizontal direction in pupil 550 (labeled "X") Similarly, there may be diffraction orders 554 arranged along a vertical direction in pupil 550 (labeled "Y"). The metrology system may be a dark-field metrology system, in which case the zeroth order may be blocked using a blocking element, an aperture stop, or the like.

In some embodiments, additional optics (not shown) in the metrology system may cause the spatial distribution of diffraction orders in pupil 550 to change (e.g., rotated). For example, the diffraction orders may be aligned to the rotated axes X' and Y', shown as dashed lines. The X, Y, X', and Y' labels are provided as an example of relative directionality and are not limiting.

In some embodiments, diffraction order(s) 552 and/or 554 may be arranged close together due to spatial constraints of inspection apparatus 400 (FIGS. 4A and 4B). For example, optical components, such as an objective, may limit the pupil diameter to less than 20 mm. Such constraints may cause difficulties in characterizing individual diffraction orders when using discrete detectors for each diffraction order (e.g., when using photodiodes). While any number or type of detectors may be used (e.g., camera, 2D array sensors), single-cell photodiodes may be more cost efficient and have reduced complexity in its electronic circuitry. However, diffraction orders 552 and/or 554 may be too close together so as to make it difficult to individual photodiodes for each diffraction order (e.g., photodiodes may be too large). To effectively use single-cell detectors, it may be preferable to separate the diffraction orders spatially (e.g., divide the pupil). However, it should be appreciated that separating diffraction orders spatially may be implemented with any type of detector(s).

Figure 6:
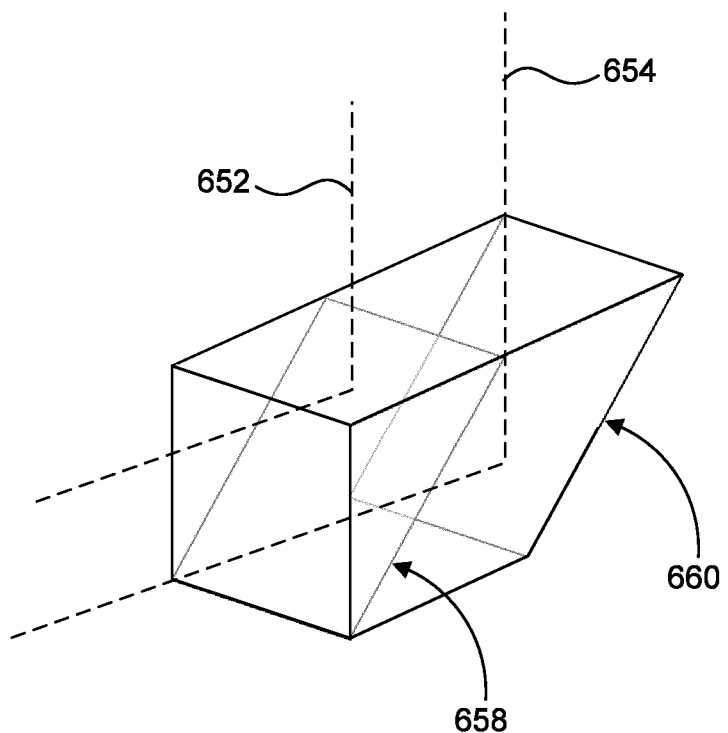
FIG. 6 shows a prism system for dividing a pupil, according to some embodiments.

FIG. 6 shows an optical system 656, e.g., a prism system, for dividing a pupil, according to some embodiments. In some embodiments, prism system 656 comprises diagonal surfaces 658 and 660. The diagonal surfaces comprise coatings that are sensitive to properties of diffraction orders 652 and 654. For example, a coating on diagonal surface 658 may reflect one of diffraction orders 652, while allowing another diffraction order 654 to pass through based on their respective polarizations.

In some embodiments, some undesirable errors in metrology may arise when using prism system 656. For example, diffraction order 652 may encounter only the coating provided on diagonal surface 658, whereas diffraction order 654 may interact with coatings on both diagonal surfaces 658 and 660. Such a difference in interaction has the potential to add undesirable errors to an intensity measurement of diffraction orders 652 and 654. Additionally, prism system 656 may be difficult to implement if diffraction orders 652 and 654 are generated by a target grating with a small pitch (e.g., 1.6-2.1 μm). In some aspects, as pitch size becomes smaller, the separation of diffraction orders 652 and 654 increases. For optical arrangement reasons, in some aspects the radiation beams of diffraction orders 652 and 654 remain close together initially and then an optical system, such as prism system 656, may separate diffraction orders 652 and 654 further downstream.

In one example, if diffraction orders 652 and 652 become too separated due to a target grating with small pitch, prism system 656 may not be large enough (e.g., due to volume constraints of the metrology system) to be in the path of both diffraction orders 652 and 654. Furthermore, in some embodiments, the manufacturing process of prism system 656 may have complexities that may introduce additional errors. For example, the coating process of diagonal surfaces 658 and 660 may be complex and assembly of prism system 656 may require tight tolerances.

Figure 7:
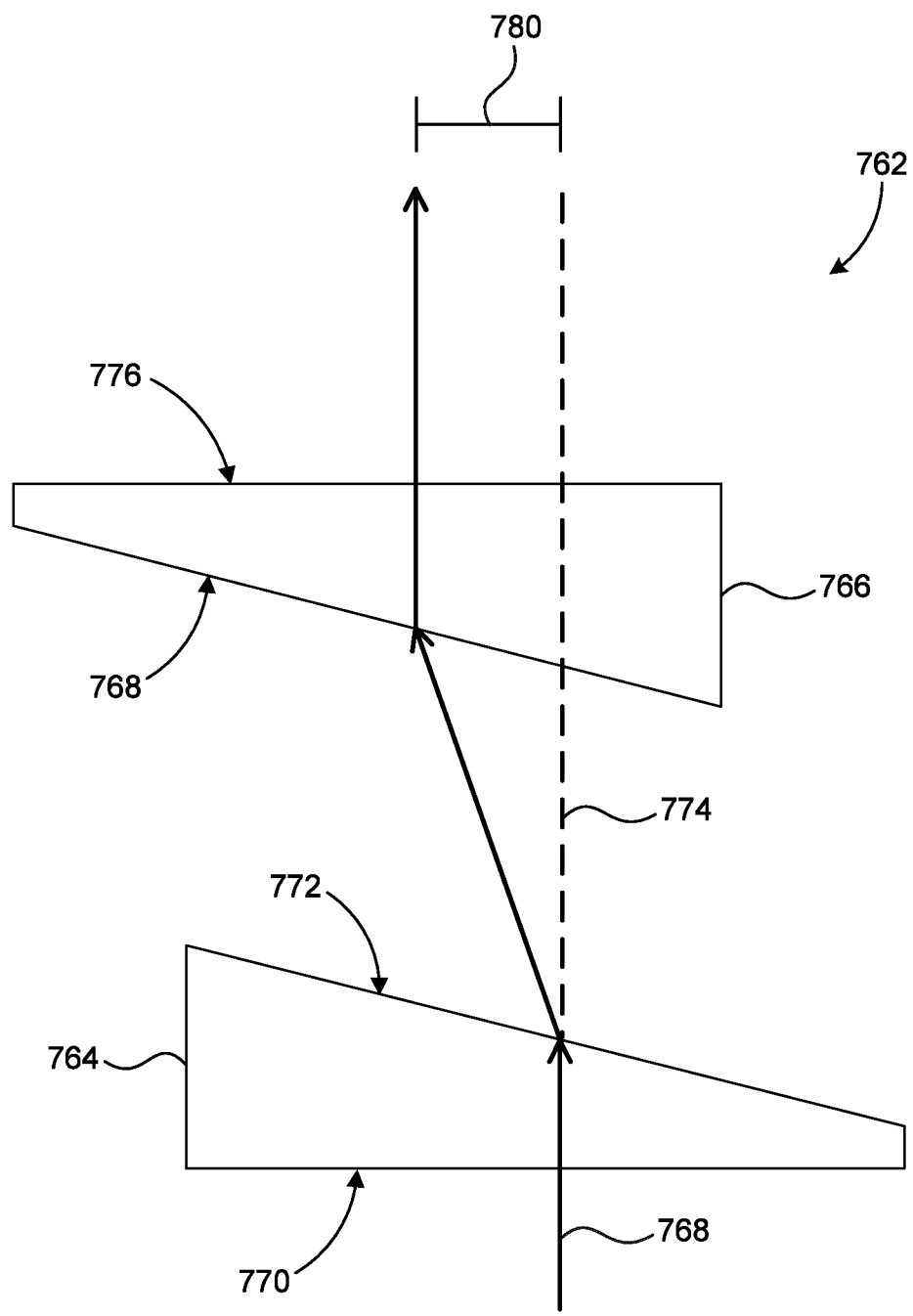
FIG. 7 shows a wedge system for dividing a pupil, according to some embodiments.

FIG. 7 shows an optical system 762, e.g., a wedge system, for dividing a pupil, according to some embodiments. The description in reference to FIG. 7 is intended to give a basic overview of optical phenomena relied upon by embodiments referencing FIGS. 8 and 9. Some aspects of how wedge system 762 may be used to overcome the above-mentioned issues with prism system 656 will be discussed in greater detail in reference to FIGS. 8 and 9.

In some embodiments, wedge system 762 comprises an optical element 764, e.g., a wedge, and an optical element 766, e.g., a wedge, (also "first wedge" and "second wedge"). Wedge system 762 may be disposed to intersect a path of a beam of radiation 768. Wedge 764 may comprise a surface 770 and a surface 772 (also "facet") that is angled with respect to surface 770. Surface 770 may be an input surface of wedge system 762 for receiving beam of radiation 768 (e.g., received at perpendicular incidence). Wedge 764 may diverge beam of radiation 768 away from an optical axis 774.

In some embodiments, wedge 766 may comprise a surface 776 and a surface 778 (also "facet") that is angled with respect to surface 776. Wedge 766 may diverge beam of radiation 768 in the opposite direction of the divergence created by wedge 764. That is, wedge 766 may refract beam of radiation 768, such that the divergence created by wedge 764 is mitigated or reversed. Surface 776 may be an output surface of wedge system 762 for transmitting beam of radiation 768 (e.g., beam exits perpendicular to surface 776). Thus, beam of radiation 768 may exit wedge system 762 along a direction parallel to optical axis 774. Consequently, wedge system 762 may separate or shift the exit path of beam of radiation 768 from an initial path (e.g., an input path) of beam of radiation 768 by a separation distance 780.

Figure 8:
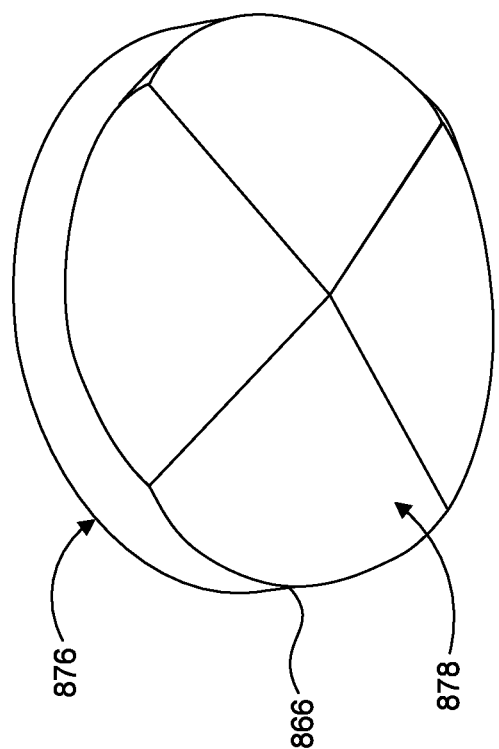
FIG. 8 shows wedges that may be used in a wedge system, according to some embodiments.
Figure 8:
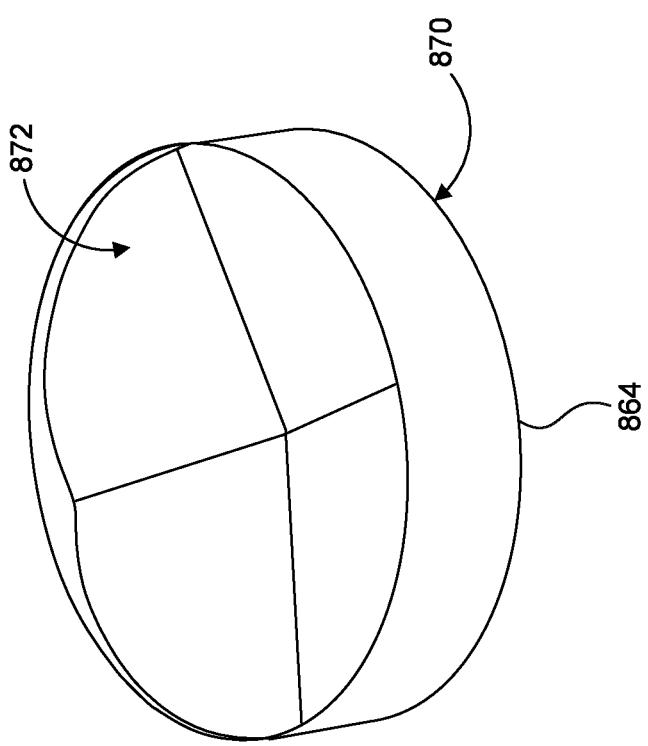

FIG. 8 shows first and second optical elements 864 and 866, e.g., first and second wedges, which may be used in an optical system, e.g., a wedge system, according to some embodiments. For clarity, the illustration in FIG. 8 is that of two independent wedges 864 and 866 yet to be arranged in an optical setup, while FIG. 9 will illustrate an embodiment(s) of an arrangement that may include wedges 864 and 866.

In some embodiments, wedge 864 may be a segmented or multi-faceted wedge. Wedge 864 may be a disc or cylinder having facets 806 arranged into quadrants of the disc. Though FIG. 8 illustrates wedge 864 as having four facets 872, it should be appreciated that fewer or more facets may be employed. Wedge 864 may also have a flat bottom surface 870 (blocked from view due to perspective) that spans a circular area of the disc. Facets 872 on wedge 864 may be designed such that wedge 864 has a concave geometry—that is, inset or recessed. Consequently, facets 872 may be at an angle with respect to flat bottom surface 870. Flat bottom surface 870 may receive a plurality of beams of radiation, for example, those of diffraction orders 552 and 554 (FIG. 5). Each facet is arranged to diverge beams of radiation received at respective quadrants.

In some embodiments, wedge 866 may be a segmented or multi-faceted wedge similar to wedge 864, but different in that wedge 866 may have a concave geometry. It is desirable for the number of facets of wedge 866 to match those of wedge 864. Wedge 866 may have a flat top surface 876 and facets 878. Facets 878 may be angled with respect to flat top surface 876 (e.g., matches the relative angle between facets 872 and flat bottom surface 870). Each of facets 878 may be matched with corresponding ones of facets 872 such that any two corresponding facets have a cross-sectional arrangement that is analogous to surfaces 770 and 778, as shown in FIG. 7.

In some embodiments, facets 878 may receive the beams of radiation that have been diverged by wedge 864. Wedge 866 may make parallel the received beams of radiation. In other words, wedge 866 may collimate the received beams of radiation.

Figure 9:
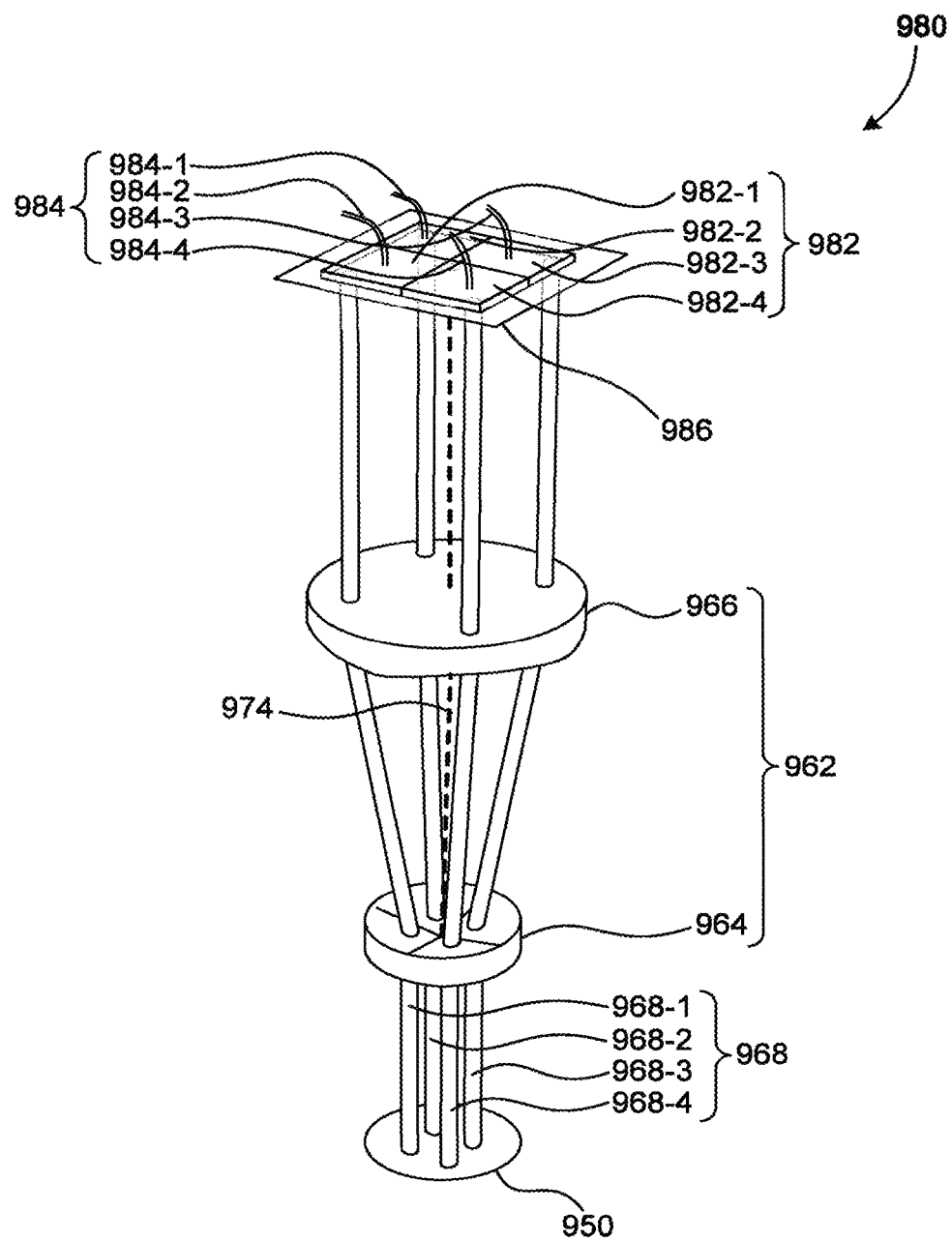
FIG. 9 shows a sensor, according to some embodiments.

FIG. 9 shows an arrangement 980, according to some embodiments. In some embodiments, arrangement 980 represents a portion of a metrology system, for example, an arrangement that includes sensor 436 of inspection apparatus 400 (FIG. 4A). In some embodiments, arrangement 980 comprises an optical system 962 and a detection system 982. In some aspects, optical system 962 is disposed between a pupil 950 and detection system 982. In some embodiments, radiation leaving an object (e.g., target 418 (FIGS. 4A and 4B)) forms, for example, beams 968-1 to 968-*n*, here n being 4. The beams 968 pass through pupil 950 with little separation. In such example, optical system 962 may expand the spacing between beams 968 before they are received at detection system 982. It should be appreciated that beams 968 may correspond to second portion of radiation 443 that was generated via beam splitter 434 (FIG. 4A).

In some embodiments, optical system 962, e.g., a wedge system, includes first and second optical elements 964 and 966, e.g., first and second wedges. In some aspects, each of wedges 964 and 966 includes, e.g., four sectors (e.g., facets shown in FIG. 8). In some aspects, respective beams 968-1 to 968-4 transmit through corresponding facets 972-1 to 972-*n* on wedge 964 and then through corresponding facets (blocked from view due to perspective) on wedge 966.

In some embodiments, wedge 964 is configured to expand or diverge beams 968 to provide more space between beams. For example, wedge 964 may have a concave exit surface that may diverge beams 968 at an angle greater than approximately 0.5 degrees with respect to a central axis 974. Central Axis 974 may also be referred to as an optical axis of beams 968. In some embodiments, the angular divergence provided by wedge 964 may be greater than approximately 1 degree. In some embodiments, the angular divergence provided by wedge 964 may be greater than approximately 2 degrees. In some embodiments, the angular divergence provided by wedge 964 may be greater than approximately 5 degrees. In some embodiments, the angular divergence provided by wedge 964 may be greater than approximately 10 degrees. In some embodiments, the angular divergence provided by wedge 964 may be greater than approximately 20 degrees. In some embodiments, the angular divergence provided by wedge 964 may be greater than approximately 30 degrees. In some embodiments, the angular divergence provided by wedge 964 may be between approximately 0.5 degrees to 45 degrees. In some embodiments, the angular divergence provided by wedge 964 may be between approximately 2 degrees to 30 degrees. In some embodiments, the angular divergence provided by wedge 964 may be between approximately 5 degrees to 20 degrees.

In some aspects, optical element 966 is configured to collimate or refract beams 968 in order to direct the now separated beams onto corresponding portions of detection system 982. In some aspects, detection system 982 includes one or more detection portions 982-1 to 982-*n*, here n being 4 (also "first detector," "second detector," and so on). Following from the previous discussion, respective beams 968-1 to 968-*n* are receive by corresponding detection portions 982-1 to 982-*n*.

In some embodiments, detection portions 982-1 to 982-*n* may each comprise a single-cell photodiode. However, in some aspects, it may be desirable to receive beams 968-1 to 968-*n* at a remote location (e.g., away from arrangement 980). Therefore, detection portions 982-1 to 982-*n* may each comprise optical couplers connected to corresponding optical fibers 984-1 to 984-*n* that guide received beams 968-1 to 968-*n* to respective photodiodes disposed at a remote location.

Wedges 964 and 966 may have structures and functions as described in reference to wedges 864 and 866 (FIG. 8). Arrangement 980 may receive beams 968 that may have been split off from scattered radiation that has been scattered by a target (also "second portion of radiation," e.g., second portion of radiation 443 (FIG. 4A)). Particularly, arrangement 980 may receive beams 968 after beams 968 propagate along paths that include wedge system 962 comprising wedges 964 and 966. Before reaching wedge system 962, beams 968 may travel through pupil 950. An example of an image at pupil 950 may be the one depicted in pupil 550 (FIG. 5). While FIG. 9 may illustrate four beams 968-1 to 968-4 (e.g., +1X, −1X, +1Y, and −1Y diffraction orders), it should be appreciated that more or fewer diffraction orders may be received by arrangement 980. Arrangement 980 may diverge beams 968 to create a diverged pupil image.

In some embodiments, beam 968-1, e.g., a first beam, may comprise a first diffraction order. Beam 968-2, e.g., a second beam, may comprise a diffraction order different from the first diffraction order. Wedge 964 may diverge beams 968 with respect to a central axis 974. Central axis 974 may be oriented parallel to a general direction of propagation of beams 968. While a first sensor may be used for determining a property of a target based on a received first portion of radiation (e.g., detector 428 receiving first portion of radiation 441 (FIG. 4A)), a second sensor (e.g., sensor 436 (FIG. 4A) using arrangement 980) may be used to determine a correction value for the property of the target based on beams 968 received at detection system 982. The determined correction value may be based on a comparison of intensity (e.g., intensity imbalance) between diverged beams 968-1 to 968-*n* (e.g., diverged diffraction orders). The metrology system may then adjust the value of the determined property using the correction value. For example, if the measured property of the target is an alignment position, the metrology system may adjust the alignment position using the correction value.

In some embodiments, wedge 966 may apply a divergence opposite to the divergence produced by wedge 964 so as to make beams 968 parallel after the beams have traversed wedge system 962. In other words, wedge 966 may collimate beams 968.

In some embodiments, detection portions 982-1 to 982-*n* may respectively receive beams 968-1 to 968-*n* after beams 968-1 to 968-*n* have been separated or spread out by wedge system 962. Detection system 982 may be disposed at a plane 986. The spatial distribution of radiation intensity at plane 986 may be described as a diverged pupil image (or separated or divided pupil image).

In some embodiments, wedge 966 is optional. For example, when wedge 966 is omitted, detection portions 982-1 to 982-*n* may be disposed more upstream such that beams 968-1 to 968-*n*, even when angled, may be incident on detection portions 982-1 to 982-*n* before the separation distance between the beams becomes too large.

Figure 10:
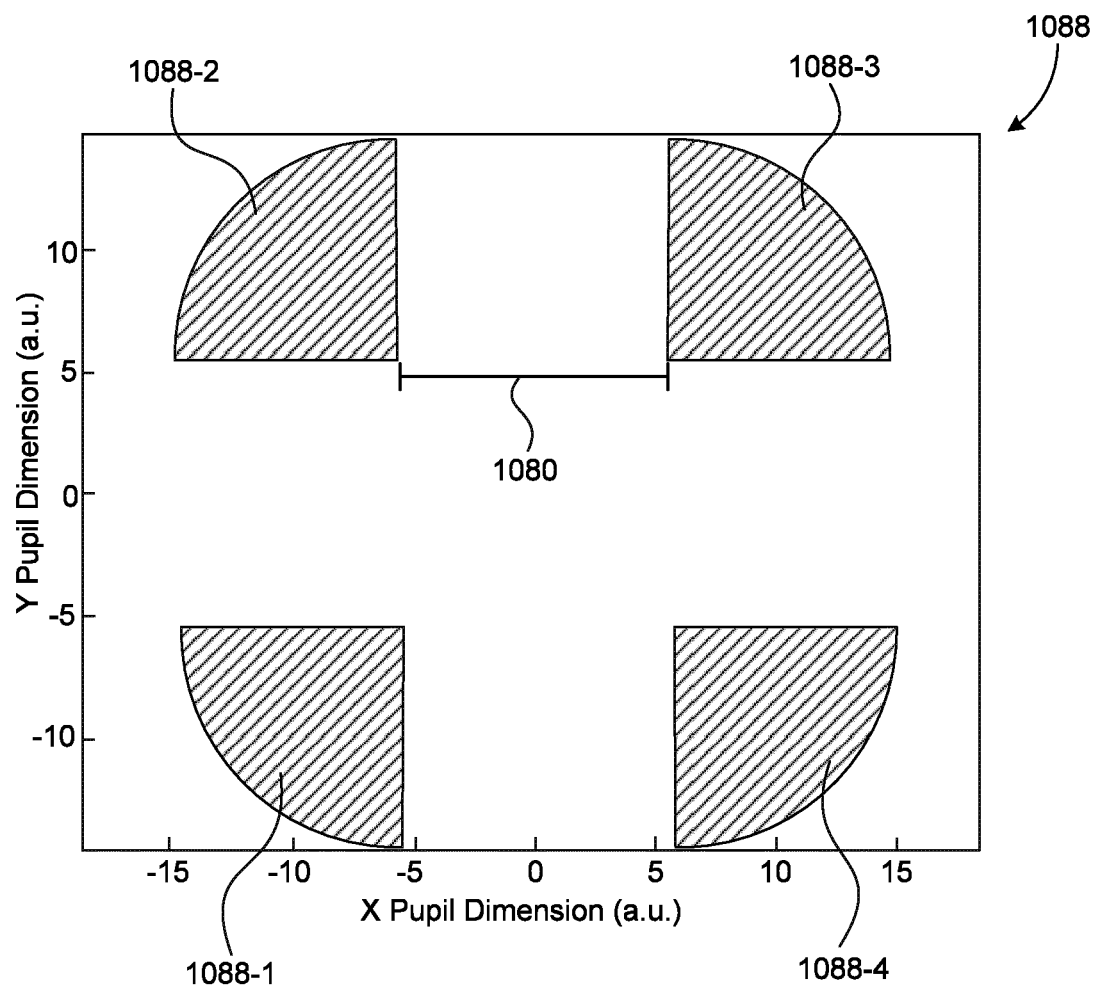
FIG. 10 shows a diverged pupil image, according to some embodiments.

FIG. 10 shows a diverged pupil image 1088, according to some embodiments. In some embodiments, diverged pupil image 1088 comprises sections 1088-1 to 1088-*n*. Here, as an example, n is 4. Section 1088-1 may be a first section, section 1088-2 may be a second section, and so on. The number of sections in diverged pupil image 1088 may be based on the number of facets on a wedge that was used to diverge an initial pupil image. An example of an initial, undiverged pupil image is illustrated in pupil 500 (FIG. 5). Diverged pupil image may form at plane 986 (FIG. 9).

In some embodiments, different diffraction orders may be present in sections 1088-1 to 1088-*n*. The diffraction orders originally may have been closer together in the initial pupil image. FIG. 10 is intended to illustrate that, not only the diffraction orders are separated, but entire sections (e.g., quadrants) of the initial pupil image may be separated relative to each other as a result of using the wedge systems shown in FIGS. 8 and 9. For example, in a scenario in which the entire initial pupil is filled with radiation, the shaded quarter circles of sections 1088-1 to 1088-*n* may each be filled with radiation while the area outside the quarter circles may have little or no radiation present.

In some embodiments, using at least wedge 964, a separation 1080 may be formed between sections 1088-1 and 1088-2. It should be appreciated that separation 1080 is not limited to just sections 1088-1 and 1088-2 and that similar separations can be defined between any of sections 1088-1 to 1088-*n*. Separation 1080 may be, for example, approximately 1 mm. In some embodiments separation 1080 may be approximately 2 mm. In some embodiments separation 1080 may be approximately 5 mm. In some embodiments separation 1080 may be approximately 10 mm. In some embodiments, separation 1080 may be between approximately 1 mm to 1 m. In some embodiments, separation 1080 may greater than approximately 1 mm. In some embodiments, separation 1080 may be greater than approximately 1 m. Large separations may be desirable if optical and/or volume constraints cause the placement of detectors to be at different ends of a metrology system.

Figure 11A:
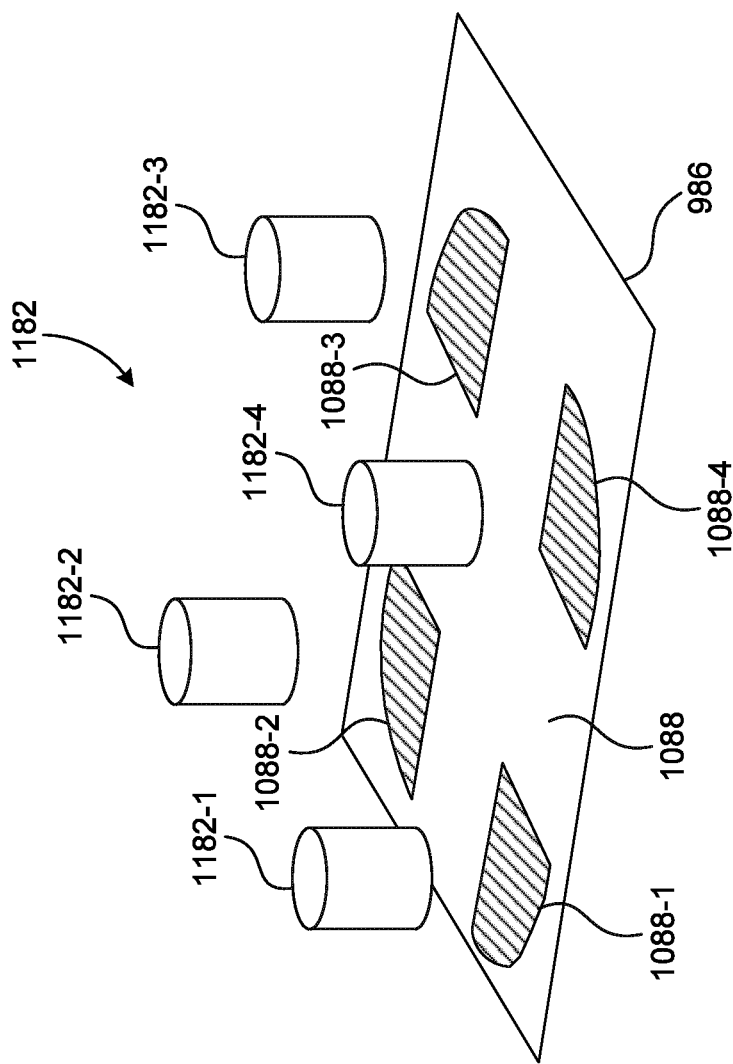
FIGS. 11A and 11B show a part of a detector system that may be used in the sensor shown in FIG. 9, according to some embodiments.

FIG. 11A shows a part of a detection system 1182 that may be used in, e.g., arrangement 980, according to some embodiments. Descriptions of embodiments referencing FIG. 11A may also refer to structures and functions described earlier in reference to FIGS. 9 and 10.

In some embodiments, detection system 1182 comprises optical couplers 1182-1 to 1182-*n*, here n being 4 (n may be different from 4). Optical couplers 1182-1 to 1182-*n* may comprise lenses (e.g., one or more lenses per coupler). Optical couplers 1182-1 to 1182-*n* may couple received beams 968-1 to 968-*n* to respective optical fibers 984-1 to 984-*n*. Optical fibers 984-1 to 984-*n* may guide received radiation to respective photodiodes. The photodiodes may generate measurement signals. A processor may receive and analyze the measurement signals to determine a correction value for a property of a measured target. In embodiments where no fibers are used, optical couplers 1182-1 to 1182-*n* may comprise lenses for focusing received beams 968-1 to 968-*n* onto respective detectors (first photodiode, second photodiode, and so on).

In some embodiments, optical couplers 1182-1 to 1182-*n* may be disposed downstream at or near plane 986. Diverged pupil image 1088 may form at plane 986. Diverged pupil image 1088 may comprise sections 1088-1 to 1088-*n*. Optical couplers 1182-1 to 1182-*n* may respectively receive radiation from sections 1088-1 to 1088-*n* of the diverged pupil image.

In some embodiments, optical coupler 1182-1 may have an optical cross section that is smaller than section 1088-1. This may be desirable when multiple diffraction orders are present in section 1088-1, but only one diffraction order is to be detected at the exclusion of others. In order to move from one diffraction order to the next within section 1088-1, optical coupler 1182-1 may be actuated. It should be understood that optical couplers 1182-2 to 1182-*n* may also have the same features as described for optical coupler 1182-1.

In some embodiments, optical coupler 1182-1 may have an optical cross section that is larger than section 1088-1. This may be desirable for simplifying the detector setup (e.g., absence of actuators and complex machinery) and optical alignment.

Figure 11B:
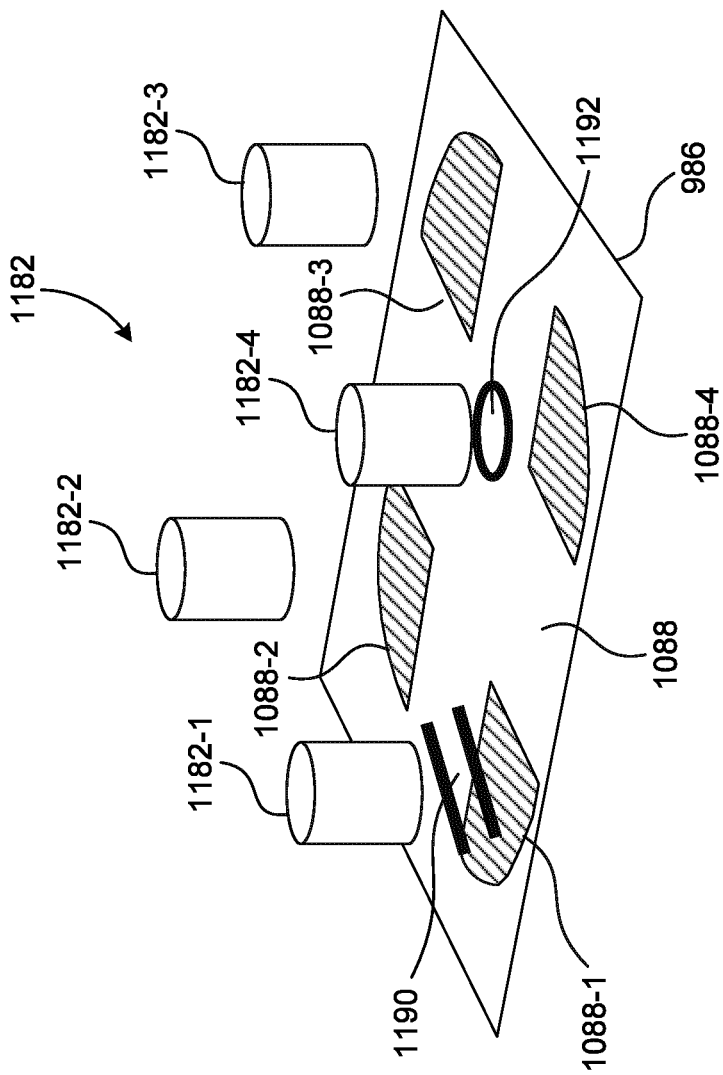

FIG. 11B shows detection system 1182 with additional optical structures, according to some embodiments. Descriptions of embodiments referencing FIG. 11B may also refer to structures and functions described earlier in reference to FIGS. 9, 10, and 11A. In some embodiments, radiation conditioning structures may be disposed at inputs of detection system 1182. For example, FIG. 11B shows a slit structure 1190 may be disposed at an input of one of optical couplers 1082-1 to 1082-*n*. In another example, an aperture 1192 may be disposed at an input of another of optical couplers 1082-1 to 1082-*n*. It should be appreciated that radiation conditioning structures are not limited to only slits and apertures and that other radiation conditioning structures may be used. While FIG. 11B illustrates a different radiation conditioning structure disposed at different inputs, it should also be appreciated that any combination of radiation conditioning structures may be disposed at inputs detection system 1182 (e.g., all the same, one of each type, pairs of each type, and the like). Radiation conditioning structure allow measuring, for example, detailed structure of diffraction orders.

In some embodiments, arrangement 980 may be a rigid assembly. That is, wedges 964 and 966, detection system 982 may be assembled and affixed such that relative positions are held constant. It was mentioned in reference to FIG. 5 that diffraction orders may become rotated in the plane of a pupil. Therefore, arrangement 980 as a rigid assembly may be actuated to align arrangement 980 to a displacement of radiation in a pupil.

It should be appreciated that, in some embodiments, arrangement 980 may be different from detector 428 (FIGS. 4A and 4B). Functions disclosed in reference to detector 428 describe determining a property of a target (e.g., alignment position) whereas arrangement 980 may be applicable to a separate measurement for seeking a correction value for the property determined by detector 428. Detector 428 was described in reference to interferometry, which may involve scanning a target to acquire an intensity signal that varies over time (e.g., intensity varies sinusoidally over time). Arrangement 980 is not limited by interferometry and may perform a determination of the correction value based on an instantaneous measurement.

Figure 12:
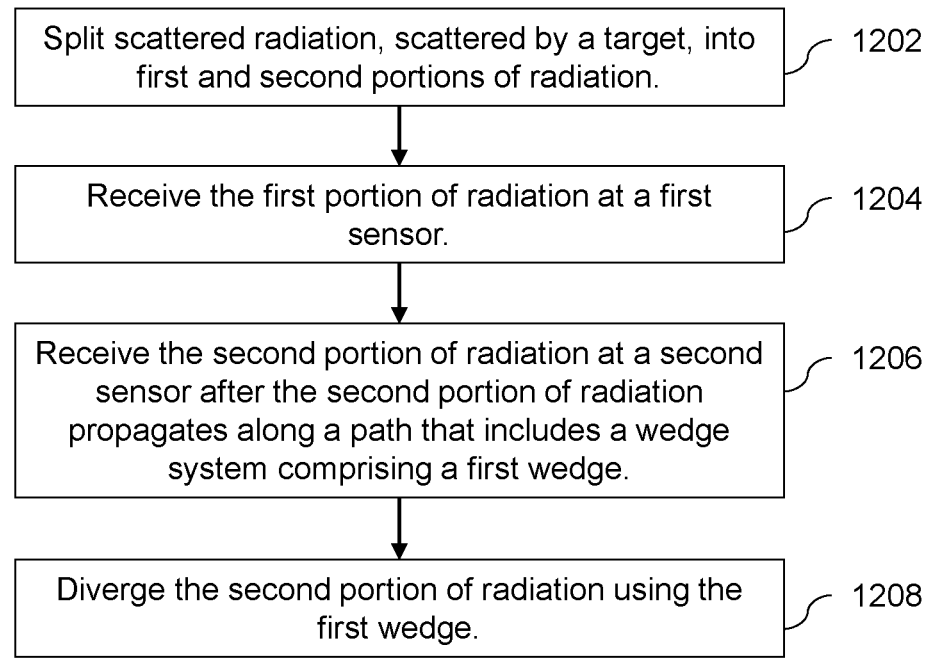
FIG. 12 shows a flowchart depicting a method, according to some embodiments.

FIG. 12 shows method steps for performing functions as described in reference to FIGS. 1-10, 11A, and 11B, according to some embodiments. At step 1202, scattered radiation, scattered by a target, may be split into first and second portions of radiation. At step 1204, the first portion of radiation may be received at a first sensor. At step 1206, the second portion of radiation may be received at a second sensor after the second portion of radiation propagates along a path that includes a wedge system comprising a first wedge. At step 1208, the second portion of radiation may be diverged using the first wedge.

The method steps of FIG. 12 may be performed in any conceivable order and it is not required that all steps be performed. Moreover, the method steps of FIG. 12 described above merely reflect an example of steps and are not limiting. That is, further method steps and functions may be envisioned based upon embodiments described in reference to FIGS. 1-10, 11A, and 11B.

The embodiments may further be described using the following clauses:

1. A metrology system comprising:
    a beam splitter configured to split scattered radiation scattered by a target into first and second portions of radiation;
    a first sensor configured to receive the first portion; and
    a second sensor configured to receive the second portion after the second portion propagates along a path that includes a wedge system comprising a first wedge configured to diverge the second portion.
2. The metrology system of clause 1, wherein:
    the second portion comprises first and second beams of radiation; and
    the first wedge is further configured to diverge the first and second beams at an angle greater than 0.5 degrees with respect to an optical axis of the second portion.
3. The metrology system of clause 1, wherein:
    the second portion comprises first and second beams of radiation; and
    the first wedge is further configured to diverge the first and second beams such that a lateral distance between the first and second beams is increased by greater than approximately 1 mm.
4. The metrology system of clause 1, wherein the wedge system comprises a second wedge configured to collimate the second portion.
5. The metrology system of clause 1, wherein the wedge system comprises a second wedge configured to receive the diverged second portion from the first wedge and to collimate the second portion before it is transmitted to the second sensor.
6. The metrology system of clause 1, wherein the first sensor is configured to determine a property of the target based on the received first portion.
7. The metrology system of clause 6, wherein the second sensor is further configured to determine a correction value for the property based on the received second portion.
8. The metrology system of clause 7, wherein the determining the correction value is further based on a comparison of an intensity imbalance between diverged radiation of the second portion.
9. The metrology system of clause 7, wherein:
    the property is an alignment position of the target; and
    the metrology system is further configured to adjust the alignment position using the correction value.
10. The metrology system of clause 1, wherein the second portion forms a pupil image before the wedge system.
11. The metrology system of clause 10, wherein the first wedge is further configured to split the pupil image into at least first and second sections and to diverge the at least first and second sections.
12. The metrology system of clause 11, wherein:
    the target comprises a grating structure;
    the first section comprises a first diffraction order from the target; and
    the second section comprises a second diffraction order from the target different from the first diffraction order.
13. The metrology system of clause 11, wherein the second sensor comprises:
    a first detector configured to receive the first section; and
    a second detection system configured to receive the second section.
14. The metrology system of clause 13, wherein the second sensor comprises an actuator configured to adjust the position of the second sensor such that the first and second detectors are aligned with any two from the first section, second section, and other sections of the pupil image split by the first wedge system.
15. The metrology system of clause 13, wherein the second sensor further comprises:
    a first aperture structure configured to condition radiation in the first section before being received at the first detector; and
    a second aperture structure configured to condition radiation in the second section before being received at the second detector.
16. The metrology system of clause 13, wherein the second sensor comprises:
    a first lens configured to focus the first section onto the first detector; and
    a second lens configured to focus the second section onto the second detector.
17. The metrology system of clause 13, wherein the detector system comprises:
    a first lens configured to select a diffraction order from among diffraction orders in the first section to focus onto the first detector; and
    a second lens configured to select a diffraction order from among diffraction orders in the second section to focus onto the second detector.
18. A lithographic apparatus comprising:
    an illumination system configured to illuminate a pattern of a patterning device;
    a projection system configured to project an image of the pattern onto a substrate; and
    a metrology system comprising:
        a beam splitter configured to split scattered radiation scattered by a target into first and second portions of radiation;
        a first sensor configured to receive the first portion; and
        a second sensor configured to receive the second portion after the second portion propagates along a path that includes a wedge system comprising a first wedge configured to diverge the second portion.
19. The lithographic apparatus of clause 18, wherein:
    the second portion forms a pupil image before the wedge system, and
    the first wedge is further configured to split the pupil image into at least first and second sections and to diverge the at least first and second sections.
20. A method comprising:
    splitting scattered radiation scattered by a target into first and second portions of radiation;

receiving the first portion at a first sensor; and
receiving the second portion at a second sensor after the second portion propagates along a path that includes a wedge system comprising a first wedge;
diverging the second portion using the first wedge.

Although specific reference can be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, LCDs, thin-film magnetic heads, etc. The skilled artisan will appreciate that, in the context of such alternative applications, any use of the terms "wafer" or "die" herein can be considered as synonymous with the more general terms "substrate" or "target portion", respectively. The substrate referred to herein can be processed, before or after exposure, in for example a track unit (a tool that typically applies a layer of resist to a substrate and develops the exposed resist), a metrology unit and/or an inspection unit. Where applicable, the disclosure herein can be applied to such and other substrate processing tools. Further, the substrate can be processed more than once, for example in order to create a multi-layer IC, so that the term substrate used herein may also refer to a substrate that already contains multiple processed layers.

Although specific reference may have been made above to the use of embodiments of the present disclosure in the context of optical lithography, it will be appreciated that the present disclosure can be used in other applications, for example imprint lithography, and where the context allows, is not limited to optical lithography. In imprint lithography a topography in a patterning device defines the pattern created on a substrate. The topography of the patterning device can be pressed into a layer of resist supplied to the substrate whereupon the resist is cured by applying electromagnetic radiation, heat, pressure or a combination thereof. The patterning device is moved out of the resist leaving a pattern in it after the resist is cured.

It is to be understood that the phraseology or terminology herein is for the purpose of description and not of limitation, such that the terminology or phraseology of the present disclosure is to be interpreted by those skilled in relevant art(s) in light of the teachings herein.

The terms "radiation," "beam," "light," "illumination," and the like as used herein may encompass all types of electromagnetic radiation, for example, ultraviolet (UV) radiation (for example, having a wavelength λ of 365, 248, 193, 157 or 126 nm), extreme ultraviolet (EUV or soft X-ray) radiation (for example, having a wavelength in the range of 5-20 nm such as, for example, 13.5 nm), or hard X-ray working at less than 5 nm, as well as particle beams, such as ion beams or electron beams. Generally, radiation having wavelengths between about 400 to about 700 nm is considered visible radiation; radiation having wavelengths between about 780-3000 nm (or larger) is considered IR radiation. UV refers to radiation with wavelengths of approximately 100-400 nm. Within lithography, the term "UV" also applies to the wavelengths that can be produced by a mercury discharge lamp: G-line 436 nm; H-line 405 nm; and/or, I-line 365 nm. Vacuum UV, or VUV (i.e., UV absorbed by gas), refers to radiation having a wavelength of approximately 100-200 nm. Deep UV (DUV) generally refers to radiation having wavelengths ranging from 126 nm to 428 nm, and in some embodiments, an excimer laser can generate DUV radiation used within a lithographic apparatus. It should be appreciated that radiation having a wavelength in the range of, for example, 5-20 nm relates to radiation with a certain wavelength band, of which at least part is in the range of 5-20 nm.

The term "substrate" as used herein describes a material onto which material layers are added. In some embodiments, the substrate itself can be patterned and materials added on top of it may also be patterned, or may remain without patterning.

Although specific reference can be made in this text to the use of the apparatus and/or system according to the present disclosure in the manufacture of ICs, it should be explicitly understood that such an apparatus and/or system has many other possible applications. For example, it can be employed in the manufacture of integrated optical systems, guidance and detection patterns for magnetic domain memories, LCD panels, thin-film magnetic heads, etc. The skilled artisan will appreciate that, in the context of such alternative applications, any use of the terms "reticle," "wafer," or "die" in this text should be considered as being replaced by the more general terms "mask," "substrate," and "target portion," respectively.

While specific embodiments of the disclosure have been described above, it will be appreciated that embodiments of the present disclosure may be practiced otherwise than as described. The descriptions are intended to be illustrative, not limiting. Thus it will be apparent to one skilled in the art that modifications may be made to the disclosure as described without departing from the scope of the claims set out below.

It is to be appreciated that the Detailed Description section, and not the Summary and Abstract sections, is intended to be used to interpret the claims. The Summary and Abstract sections may set forth one or more but not all exemplary embodiments of the present disclosure as contemplated by the inventor(s), and thus, are not intended to limit the present disclosure and the appended claims in any way.

The present disclosure has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein.

The breadth and scope of the protected subject matter should not be limited by any of the above-described exemplary embodiments, but should be defined only in accordance with the following claims and their equivalents.

The invention claimed is:
1. A metrology system comprising:
a beam splitter configured to split scattered radiation scattered by a target into first and second portions of radiation;

a first sensor configured to receive the first portion;
a second sensor configured to receive the second portion after the second portion propagates along a path, wherein the second portion comprises plural beams; and
an optical system, disposed between a pupil image and the second sensor, comprising first and second optical elements configured to process the beams, each of the first and the second optical elements comprising a plurality of wedge surfaces, wherein:
the first and the second optical elements are arranged in series along the path and the wedge surfaces of the first element face the wedge surfaces of the second element,
the wedge surfaces of the first optical element are configured with a concave exit surface to diverge the beams to thereby increase lateral separation between the beams, and
the wedge surfaces of the second optical element are configured to collimate the beams before being transmitted to the second sensor.

2. The metrology system of claim 1, wherein:
the first optical element is further configured to diverge the beams at an angle greater than 0.5 degrees with respect to an optical axis of the path.

3. The metrology system of claim 1, wherein:
the first optical element is further configured to diverge the beams such that a lateral distance between two adjacent beams is increased by greater than approximately 1 mm.

4. The metrology system of claim 1, wherein the first sensor is configured to determine a property of the target based on the received first portion.

5. The metrology system of claim 4, wherein the second sensor is further configured to determine a correction value for the property based on the received second portion.

6. The metrology system of claim 5, wherein the determining the correction value is further based on a comparison of an intensity imbalance between diverged radiation of the second portion.

7. The metrology system of claim 5, wherein:
the property is an alignment position of the target; and
the metrology system is further configured to adjust the alignment position using the correction value.

8. The metrology system of claim 1, wherein the pupil image is formed before the first and the second optical elements.

9. The metrology system of claim 8, wherein:
the target comprises a grating structure;
the first section comprises a first diffraction order from the target; and
the second section comprises a second diffraction order from the target different from the first diffraction order.

10. The metrology system of claim 8, wherein the second sensor comprises:
a first detector configured to receive the first section; and
a second detector configured to receive the second section.

11. The metrology system of claim 10, wherein the second sensor comprises an actuator configured to adjust the position of the second sensor such that the first and second detectors are aligned with any two from the first section, second section, and other sections of the pupil image.

12. The metrology system of claim 10, wherein the second sensor further comprises:
a first aperture structure configured to condition radiation in the first section before being received at the first detector; and
a second aperture structure configured to condition radiation in the second section before being received at the second detector.

13. The metrology system of claim 10, wherein the second sensor comprises:
a first lens configured to focus the first section onto the first detector; and
a second lens configured to focus the second section onto the second detector.

14. The metrology system of claim 10, further comprising:
a first lens configured to select a diffraction order from among diffraction orders in the first section to focus onto the first detector; and
a second lens configured to select a diffraction order from among diffraction orders in the second section to focus onto the second detector.

15. A lithographic apparatus comprising:
an illumination system configured to illuminate a pattern of a patterning device;
a projection system configured to project an image of the pattern onto a substrate; and
the metrology system of claim 1.

16. The lithographic apparatus of claim 15, wherein:
the second portion forms a pupil image before the first and second optical elements.

17. The lithographic apparatus of claim 15, wherein:
the beam splitter is configured to split the radiation scattered by the target into third and fourth portions of radiation; and
the first and the second optical elements each comprise four wedge surfaces.

18. The metrology system of claim 1, wherein:
the beam splitter is configured to split the radiation scattered by the target into third and fourth portions of radiation; and
the first and the second optical elements each comprise four wedge surfaces.

19. A method comprising:
splitting scattered radiation scattered by a target into first and second portions of radiation;
receiving the first portion at a first sensor;
receiving the second portion at a second sensor after the second portion propagates beams along a path through first and second serial optical elements each comprising wedge surfaces, the wedge surfaces of the first optical element facing the wedge surfaces of the second optical element;
increasing, using the wedge surfaces of the first optical element that are concave, lateral separation between the beams; and
collimating, using the wedge surfaces of the second optical element, the beams before transmitting the beams to the second sensor.

20. The method of claim 19, further comprising using four wedge surfaces for each of the first and the second optical elements.

* * * * *